United States Patent [19]
Kreifels et al.

[11] Patent Number: 5,412,793
[45] Date of Patent: May 2, 1995

[54] METHOD FOR TESTING ERASE CHARACTERISTICS OF A FLASH MEMORY ARRAY

[75] Inventors: Jerry Kreifels, Citrus Heights; Mickey L. Fandrich, Placerville; William Smith, Fair Oaks, all of Calif.

[73] Assignee: Intel Corporation, Santa Clara, Calif.

[21] Appl. No.: 277,369

[22] Filed: Jul. 19, 1994

Related U.S. Application Data

[63] Continuation of Ser. No. 801,953, Dec. 3, 1991, abandoned.

[51] Int. Cl.$^6$ ............................................. G06F 12/00
[52] U.S. Cl. ................................. 395/425; 371/21.1; 365/201; 365/218
[58] Field of Search .......................... 395/425; 364/200 MS File, 900 MS File, DIG. 1, DIG. 2; 371/21.1, 21.2; 365/185, 189.07, 201, 218

[56] References Cited

U.S. PATENT DOCUMENTS

| | | | |
|---|---|---|---|
| 4,460,982 | 7/1984 | Gee et al. | 365/189.07 |
| 4,701,886 | 10/1987 | Sakakibara et al. | 365/189 |
| 4,811,294 | 3/1989 | Kobayashi et al. | 365/189.07 |
| 5,014,191 | 5/1991 | Padgaonkar et al. | 364/200 |
| 5,034,922 | 7/1991 | Burgess | 365/189.07 |
| 5,053,990 | 10/1991 | Kreifels et al. | 365/218 |
| 5,233,559 | 8/1993 | Brennan, Jr. | 365/200 |

*Primary Examiner*—Jack B. Harvey
*Assistant Examiner*—Jack A. Lane
*Attorney, Agent, or Firm*—Blakely, Sokoloff, Taylor & Zafman

[57] ABSTRACT

A method of determining erasure characteristics of a nonvolatile semiconductor memory array using an on-board write state machine is described. The method begins by configuring the write state machine to apply a single erase pulse to the array and then issuing an erase command. If array erasure is unsuccessful, another erase command is issued. Erase commands are reissued until every address within the array is successfully erased.

7 Claims, 18 Drawing Sheets

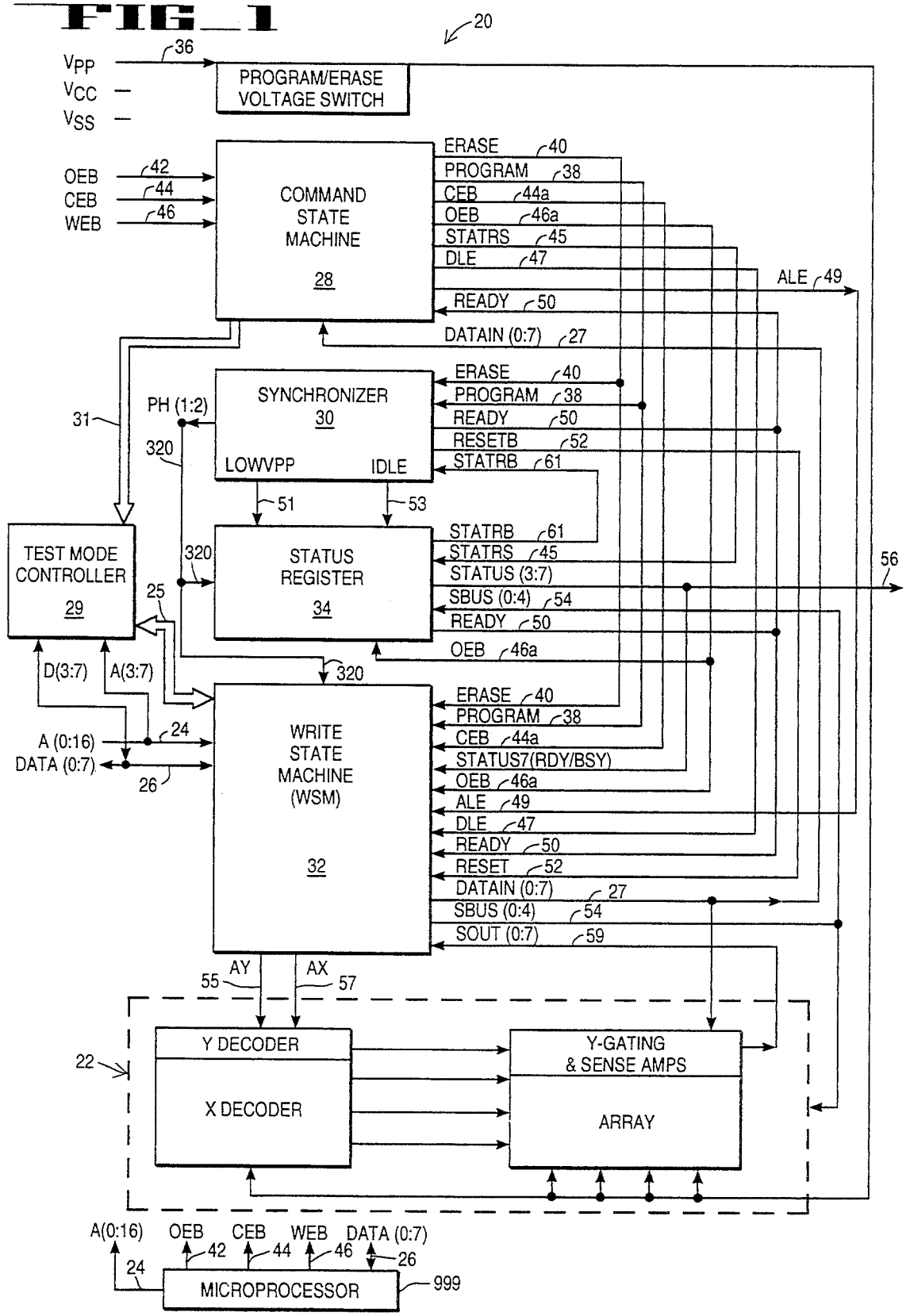

FIG_2

TABLE I

| COMMAND | BUS CYCLES REQUIRED | FIRST BUS CYCLE | | | SECOND BUS CYCLE | | |
|---|---|---|---|---|---|---|---|
| | | OPERATION | ADDRESS | DATA | OPERATION | ADDRESS | DATA |
| READ ARRAY | 1 | WRITE | X | FFH | | | |
| READ STATUS REGISTER | 2 | WRITE | X | 70H | READ | X | SRD |
| CLEAR STATUS REGISTER | 1 | WRITE | X | 50H | | | |
| ERASE SETUP/ERASE CONFIRM | 2 | WRITE | BA | 20H | WRITE | BA | D0H |
| PROGRAM SETUP/PROGRAM | 2 | WRITE | X | 40H | WRITE | PA | PD |
| WRITE TEST LATCH | 2 | WRITE | X | 5FH | WRITE | TEST REGISTERS | TD |
| TEST MODE GO | 1 | WRITE | X | 2FH | | | |
| TEST MODE STOP | 1 | WRITE | X | 3FH | | | |
| USER MODE READS | 1 | WRITE | X | 1FH | | | |
| READ TEST LATCH | 1 | WRITE | X | 0FH | | | |

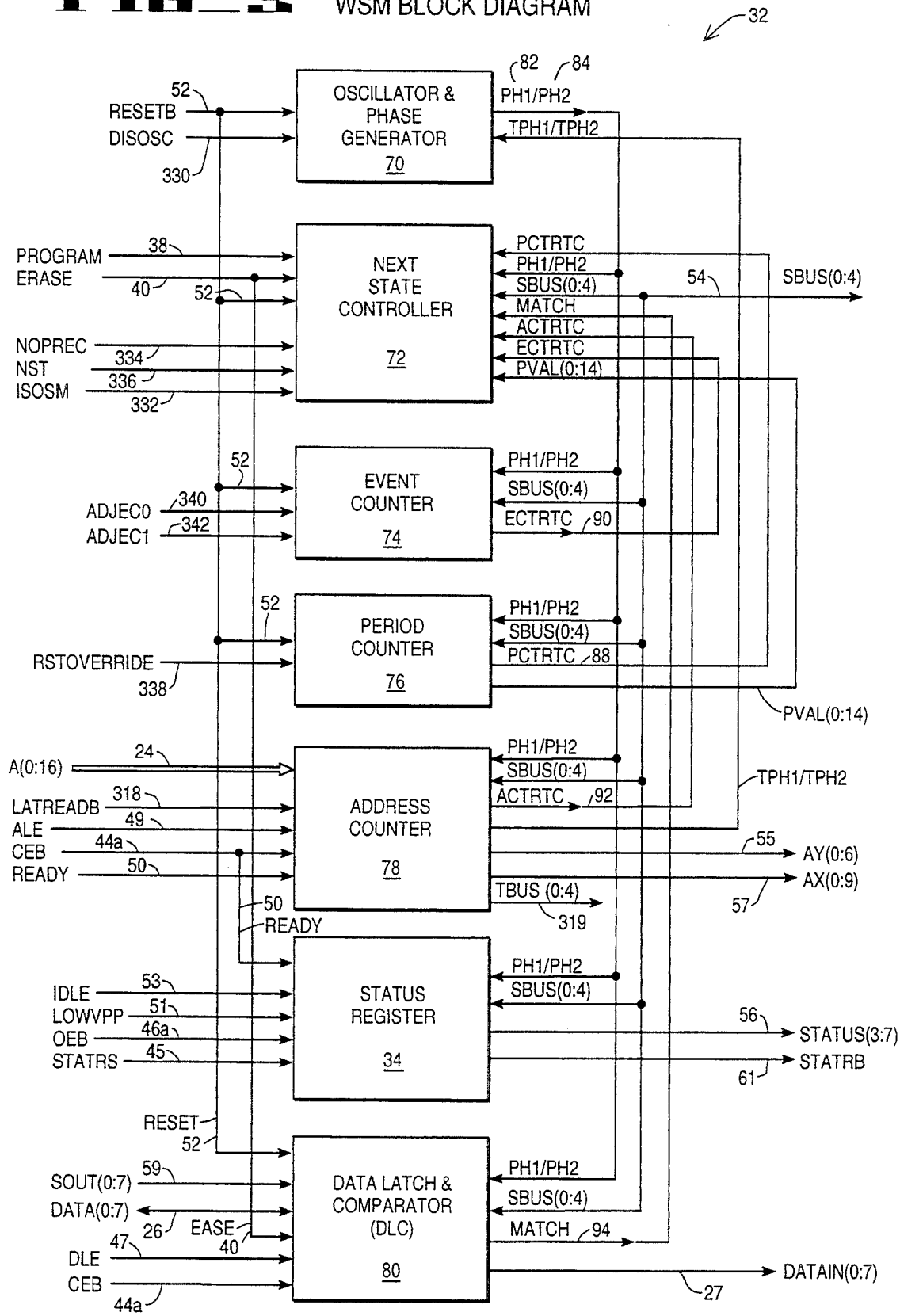
FIG_3  WSM BLOCK DIAGRAM

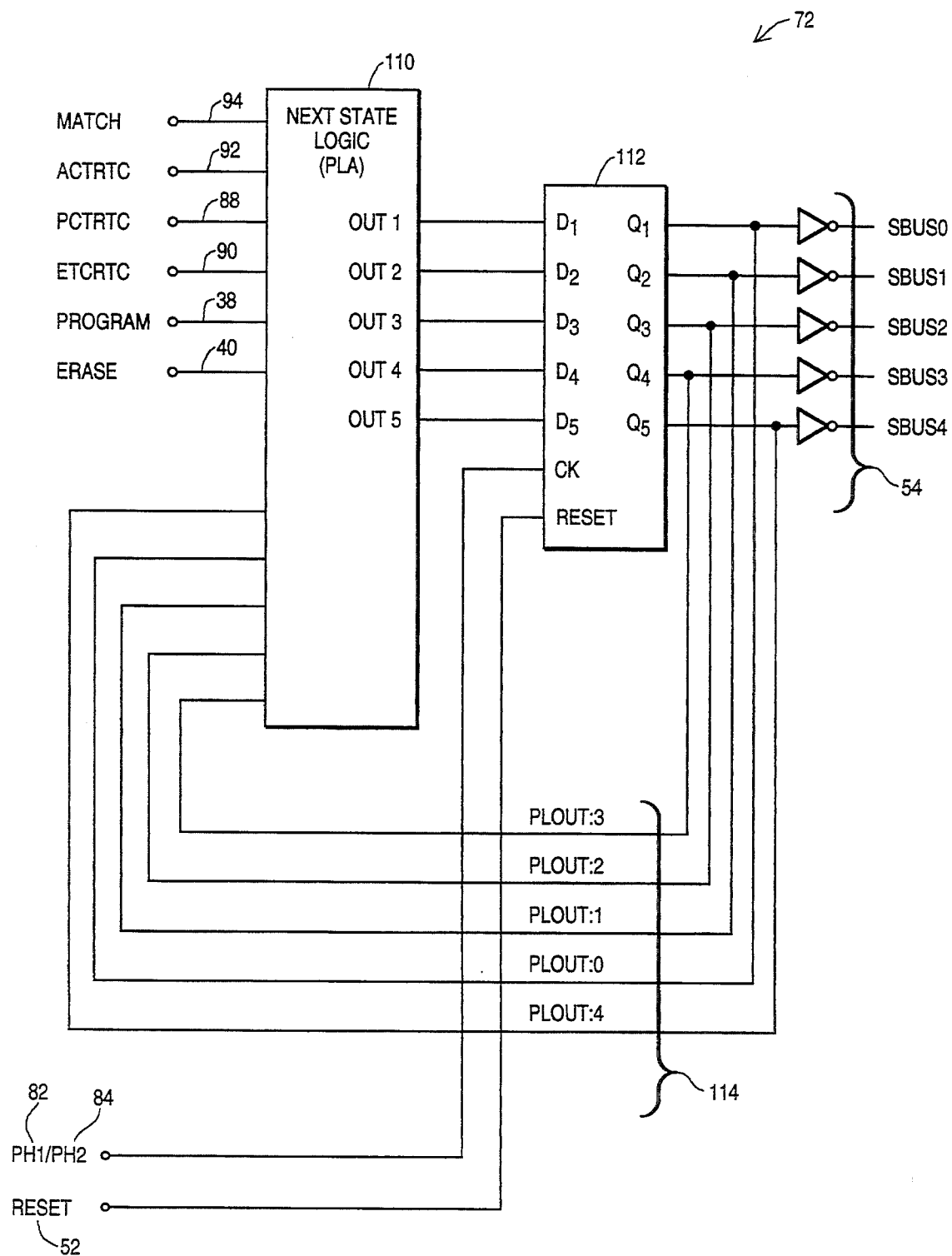
FIG_4 NEXT STATE CONTROLLER

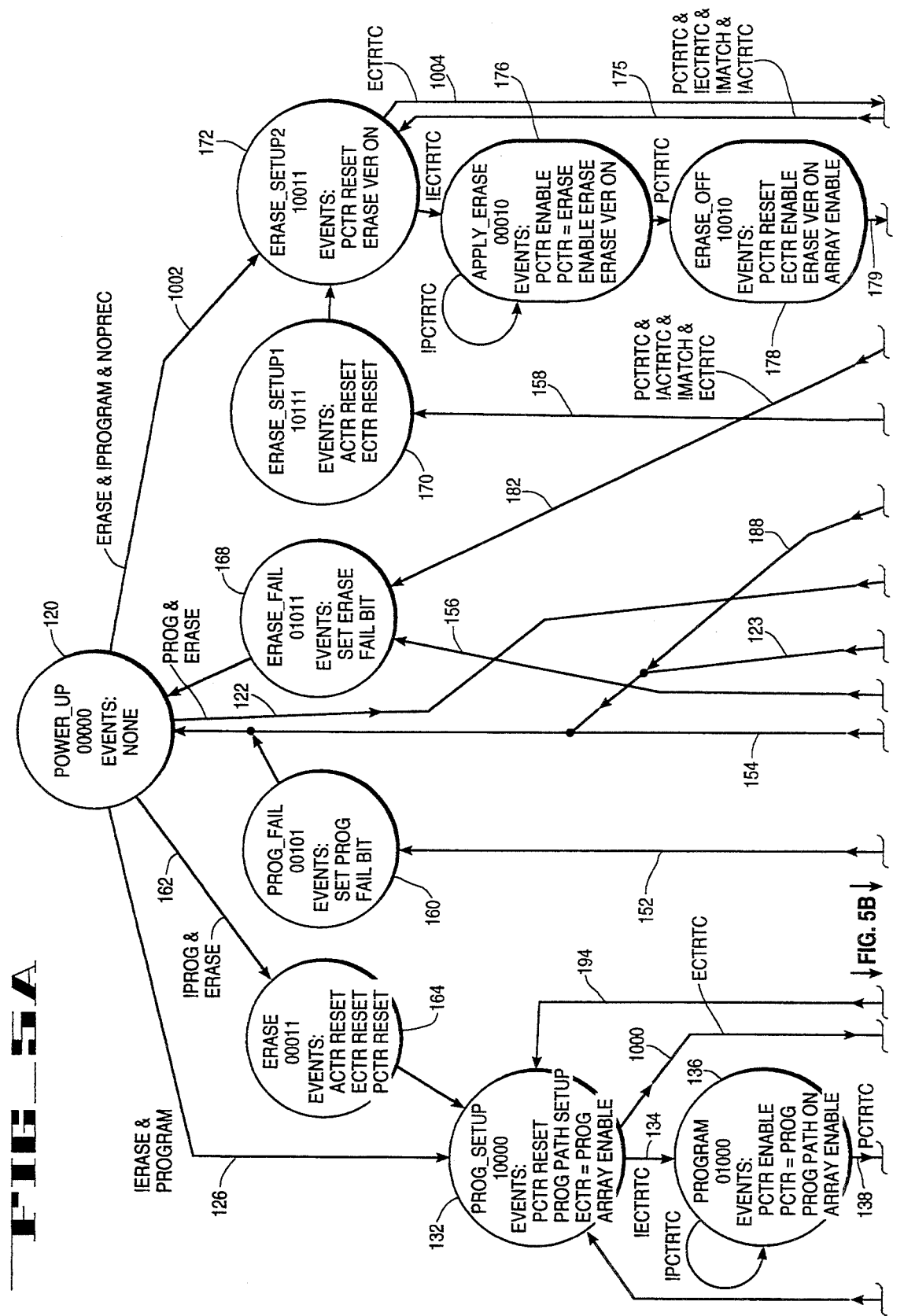

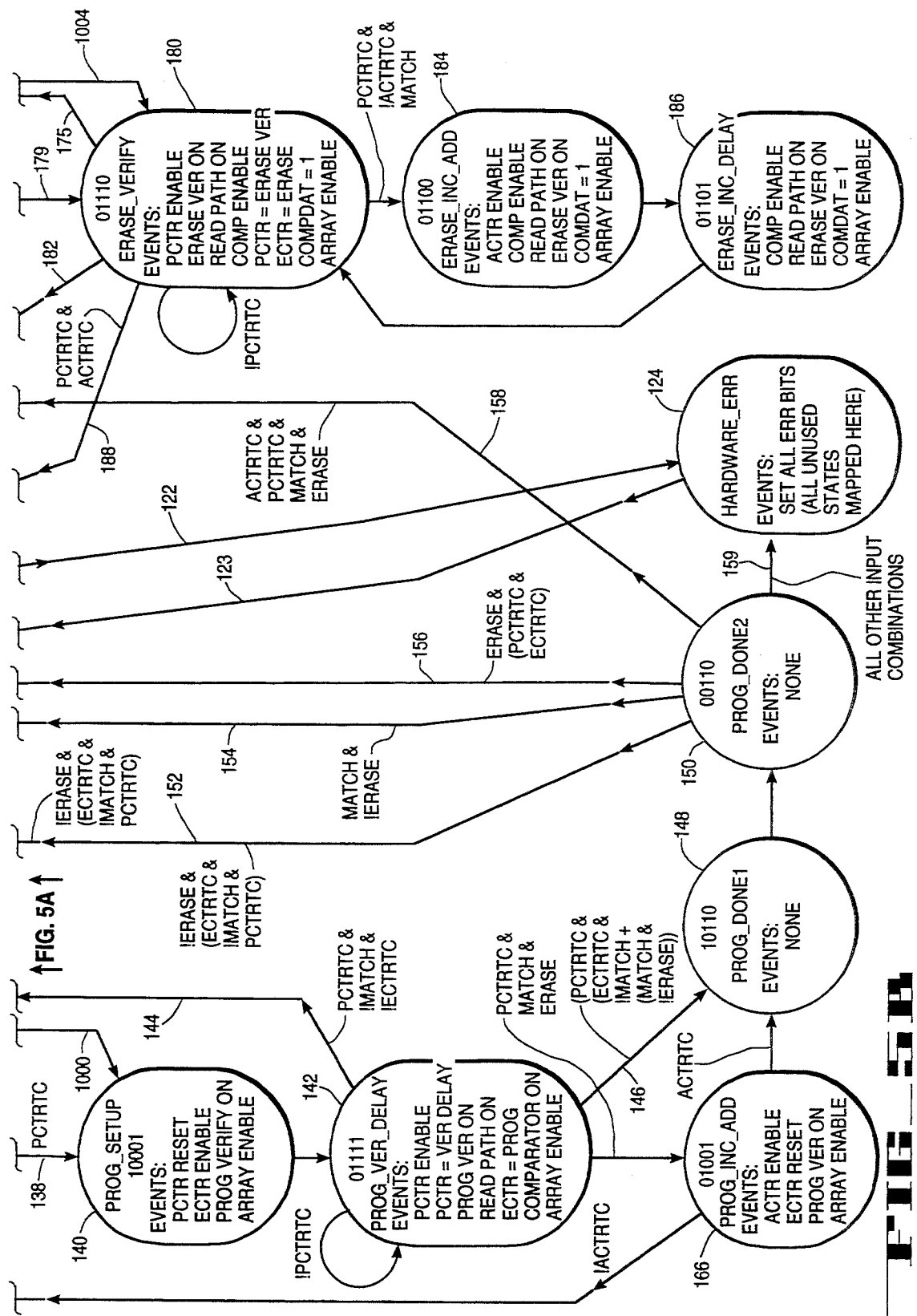

FIG_6

TABLE II

| SBUS | ECTRST | ECTREN | ECTRES | ECTRPG | PCTRST | PCTSEPGM | PCTSEPGM | PCTSEVER | PDE | COMPEN | COMPDAT1 | EREADY | ERSFAIL | PGMFAIL | ACTRST | ACTREN | PGSETUP | PGM | ERASEE | ERVER | PGVER | AE | STATE NAME |
|---|---|---|---|---|---|---|---|---|---|---|---|---|---|---|---|---|---|---|---|---|---|---|---|
| 00000 | 0 | 0 | 0 | 0 | 0 | 0 | 0 | 0 | 0 | - | - | 0 | 0 | 0 | 0 | 0 | 0 | 0 | 0 | 0 | 0 | 0 | POWER_UP |
| 00010 | - | 0 | - | 0 | 0 | 0 | 0 | 0 | 0 | - | - | 0 | 0 | 0 | 0 | 0 | 0 | 0 | 1 | 1 | 0 | 0 | APPLY_ERASE |
| 00011 | 1 | - | 0 | 0 | 1 | 0 | 0 | 0 | 0 | - | - | 0 | 0 | 0 | 0 | 1 | 0 | 0 | 0 | 0 | 0 | 0 | ERASE |
| 00101 | 0 | 0 | 0 | 0 | 0 | 0 | 0 | 0 | 0 | - | - | 0 | 0 | 0 | 0 | 0 | 0 | 0 | 0 | 0 | 0 | 0 | PROG_FAIL |
| 01001 | 0 | 0 | 0 | 0 | 0 | 1 | 0 | 0 | 0 | 0 | - | 1 | 0 | 0 | 0 | 0 | 0 | 1 | 0 | 0 | 0 | 1 | PROGRAM |
| 01011 | 0 | 0 | 0 | 0 | 0 | 0 | 0 | 0 | 0 | - | - | 1 | 0 | 0 | 1 | 0 | 0 | 0 | 0 | 0 | 0 | 1 | PROG_INC_ADD |
| 01100 | 0 | 0 | 0 | 0 | 0 | 0 | 0 | 0 | 0 | - | - | 1 | 0 | 1 | 0 | 0 | 0 | 0 | 0 | 0 | 0 | 0 | ERASE_FAIL |
| 01101 | 0 | 0 | 0 | 0 | 0 | 0 | 0 | 0 | 0 | - | - | 1 | 1 | 0 | 0 | 0 | 0 | 0 | 0 | 0 | 0 | 0 | ERASE_INC_ADD |
| 01110 | 0 | 0 | 0 | 0 | 0 | 0 | 0 | 0 | 0 | - | - | 0 | 0 | 0 | 0 | 0 | 0 | 0 | 0 | 0 | 0 | - | ERASE_INC_DELAY |
| 01111 | 0 | 0 | 0 | 0 | 0 | 0 | 0 | 0 | 0 | 0 | - | 0 | 0 | 0 | 0 | 0 | 0 | 0 | 0 | 0 | 1 | - | ERASE_VERIFY |
| 10000 | 0 | 0 | 0 | 0 | 0 | 0 | 0 | 0 | 0 | - | - | 0 | 0 | 0 | 0 | 0 | 0 | 0 | 0 | 0 | 0 | - | PROG_VER_DELAY |
| 10001 | 0 | 0 | 0 | 0 | 0 | 0 | 0 | 0 | 0 | - | 0 | 0 | 0 | 0 | 0 | 0 | 0 | 0 | 0 | 1 | 1 | 1 | PROG_SETUP |
| 10010 | 0 | 0 | 0 | 0 | 0 | 0 | 0 | 0 | 0 | 0 | - | 0 | 0 | 0 | 0 | 0 | 0 | 0 | 0 | 0 | 0 | 1 | PROG_EQ |
| 10011 | 0 | 0 | 0 | 0 | 0 | 0 | 0 | 0 | 0 | 0 | - | 0 | 0 | 0 | 0 | 0 | 0 | 0 | 0 | 0 | 0 | 1 | ERASE_OFF |
| 10110 | 0 | 0 | 0 | 0 | 0 | 0 | 0 | 0 | 0 | 0 | - | 0 | 0 | 0 | 0 | 0 | 0 | 0 | 0 | 0 | 0 | 1 | ERASE_SETUP2 |
| 10111 | 0 | 0 | 0 | 0 | 0 | 0 | 0 | 0 | 0 | 0 | - | 0 | 1 | 1 | 0 | 0 | 0 | 0 | 0 | 0 | 0 | 0 | ERASE_IDLE |
| 11000 | - | 0 | 0 | 0 | - | 0 | 0 | 0 | - | 0 | - | - | - | - | - | - | 0 | 0 | 0 | 0 | 0 | - | PROGRAM_DONE1 |
| 11001 | - | - | 0 | 0 | - | 0 | 0 | 0 | - | 0 | - | - | - | - | - | - | 0 | 0 | 0 | 0 | 0 | - | ERASE_SETUP1 |
| 11111 | - | - | 0 | 0 | - | 0 | 0 | 0 | - | - | - | - | - | - | - | - | 0 | 0 | 0 | 0 | 0 | - | HARDWARE_ERRS |

FIG. 7

| SIGNAL ACRONYM | SIGNAL NAME |
|---|---|
| ECTRST | EVENT COUNTER RESET |
| ECTREN | EVENT COUNTER ENABLE |
| ECTRER | EVENT COUNTER TC OUT = ERASE NOMINAL (2000) |
| ECTRPG | EVENT COUNTER TC OUT = PROGRAM NOMINAL (50) |
| PCTRST | PERIOD COUNTER RESET (PCTR RUNS IN ALL STATES RESET IS NOT ASSERTED) |
| PCTSELERS | PERIOD COUNTER TC OUT = ERASE PULSE WIDTH |
| PCTSELPGM | PERIOD COUNTER TC OUT = PROGRAM PULSE WIDTH |
| PCTSELVER | PERIOD COUNTER OUT = 0.5 SECOND ERASE |
| DE | DATA PATH ENABLE (SENSE AMPS/DRAIN BIAS, ETC.) |
| COMPEN | COMPARATOR ENABLED |
| COMPDAT1 | FORCE COMPARATOR DATA TO 1 IF ERASE MODE |
| READY | SET RDY/BSY# = 1 |
| ERSFAIL | SET ERASE FAIL BIT |
| PGMFAIL | SET PROGRAM FAIL BIT |
| ACTRST | ADDRESS COUNTER RESET |
| ACTREN | ADDRESS COUNTER ENABLED FOR COUNTING |
| PGSETUP | PROGRAM SETUP |
| PGM | PROGRAM DATA IN |
| ERASE | APPLY ERASE VOLTAGES |
| ERVER | TURN ERASE VERIFY CIRCUITRY ON |
| PGVER | TURN PROGRAM VERIFY CIRCUITRY ON |
| AE | ENABLE THE ARRAY (X DECODERS, ETC.) |

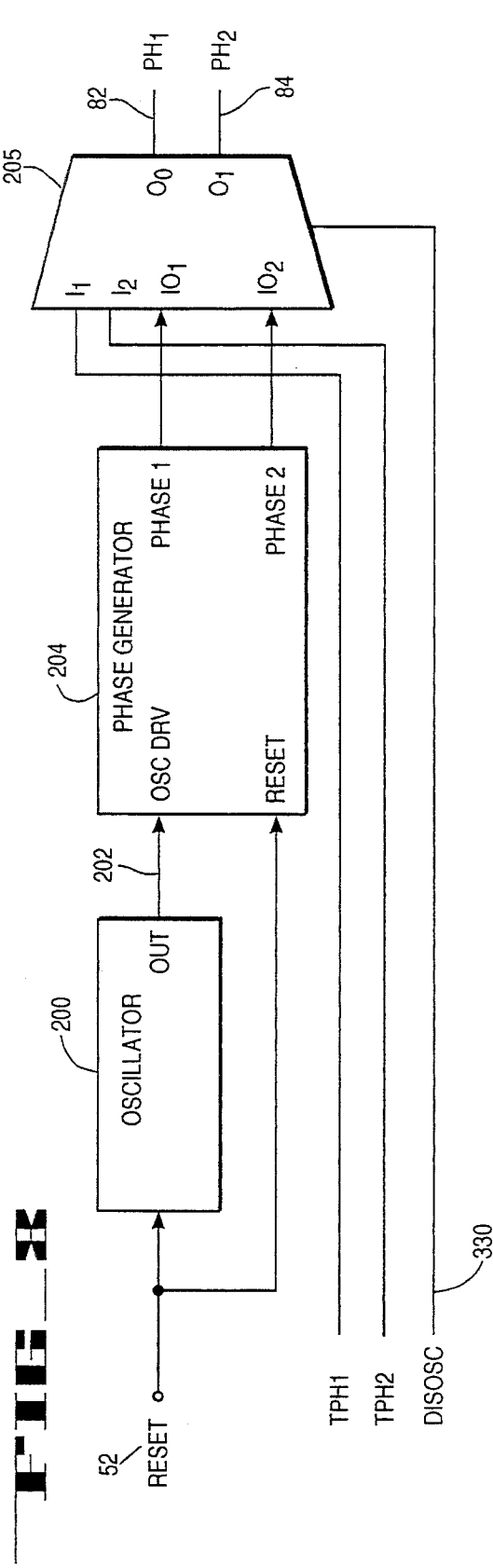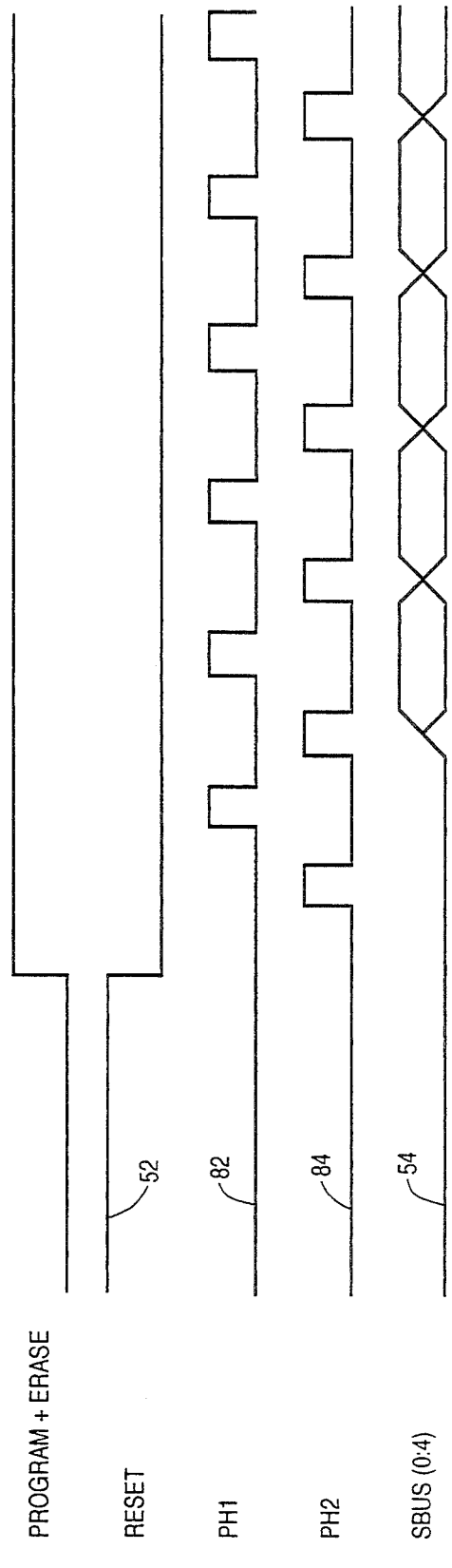

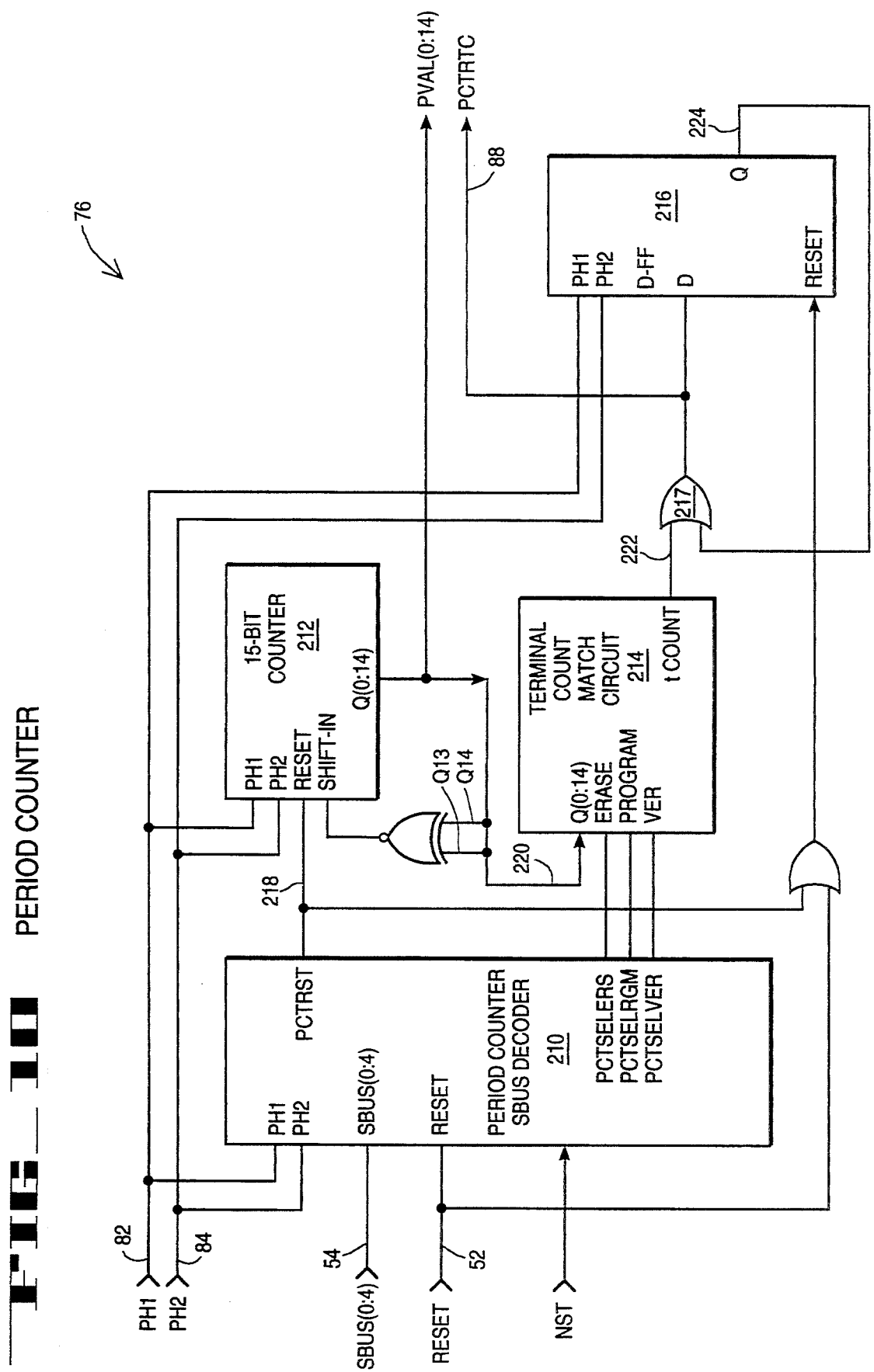
FIG_10 PERIOD COUNTER

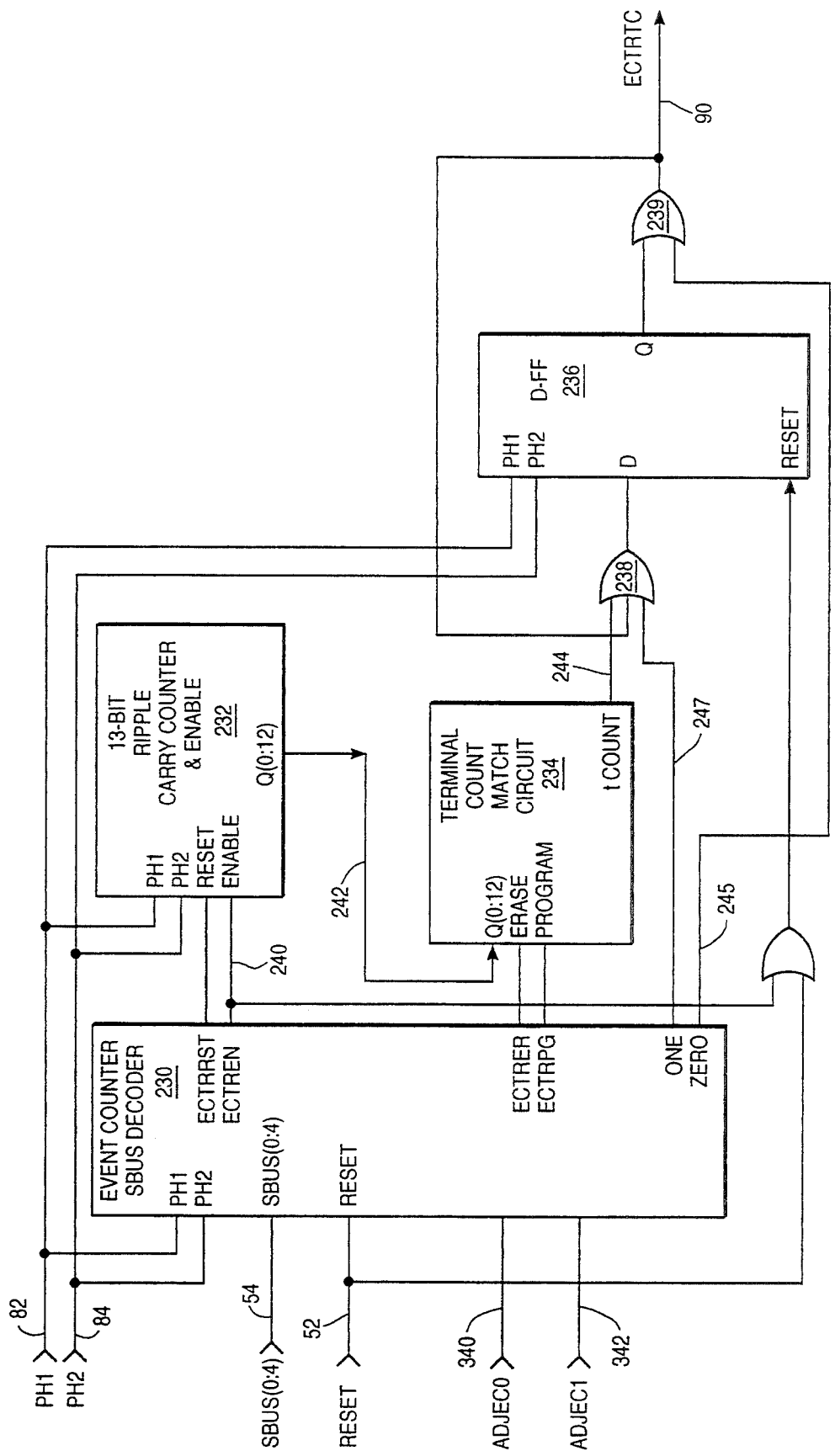
FIG. 11   EVENT COUNTER

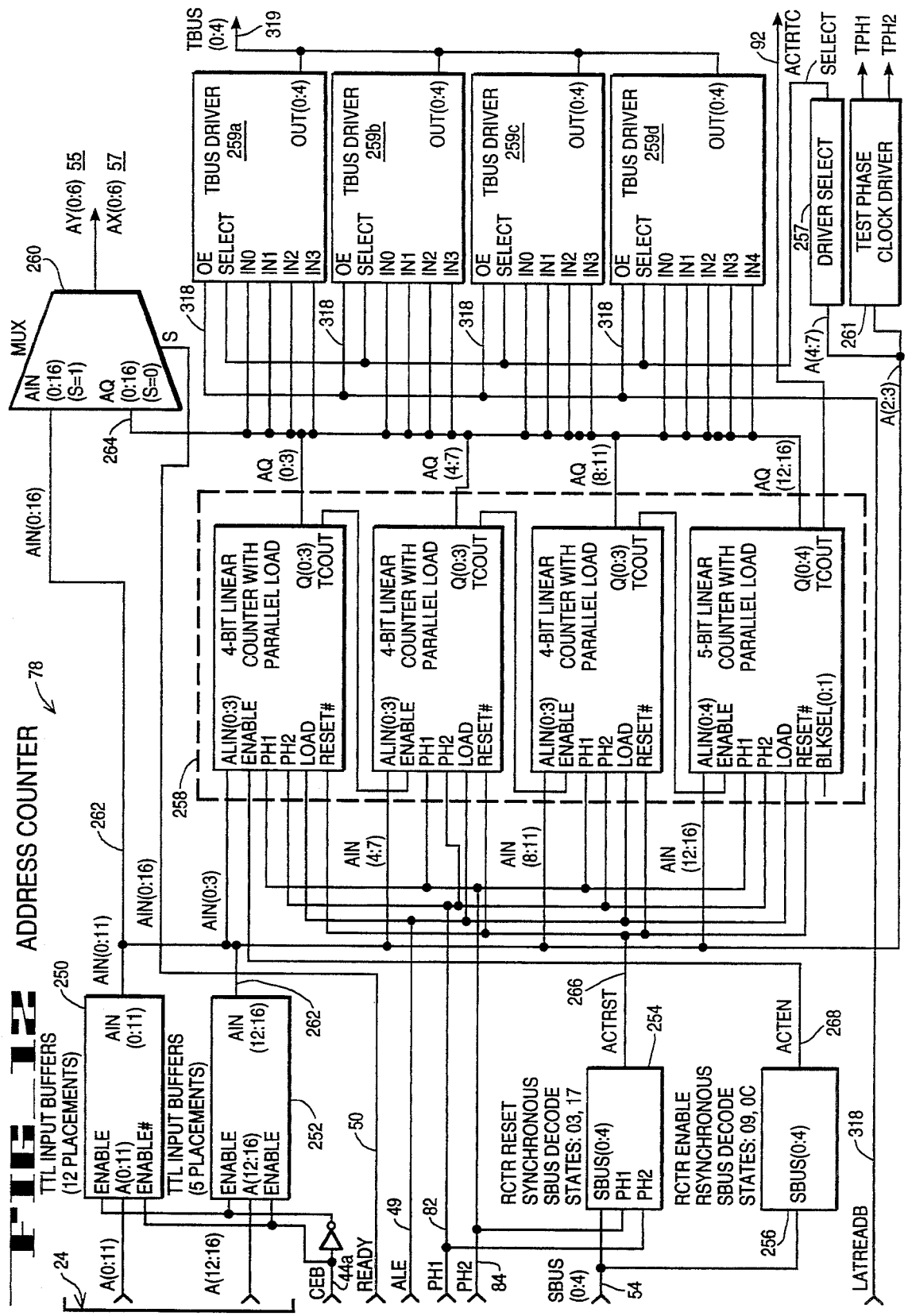

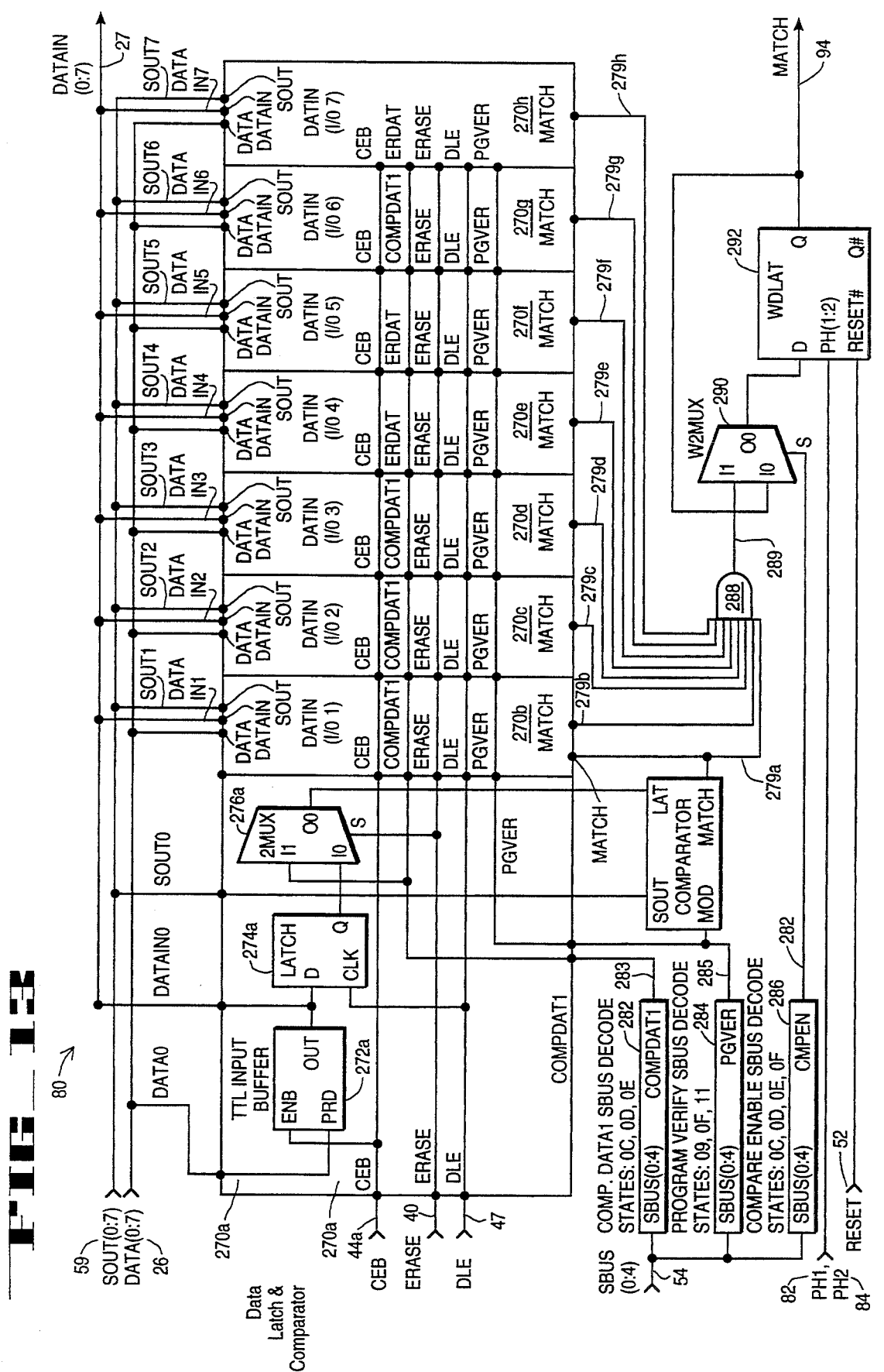
FIG_13

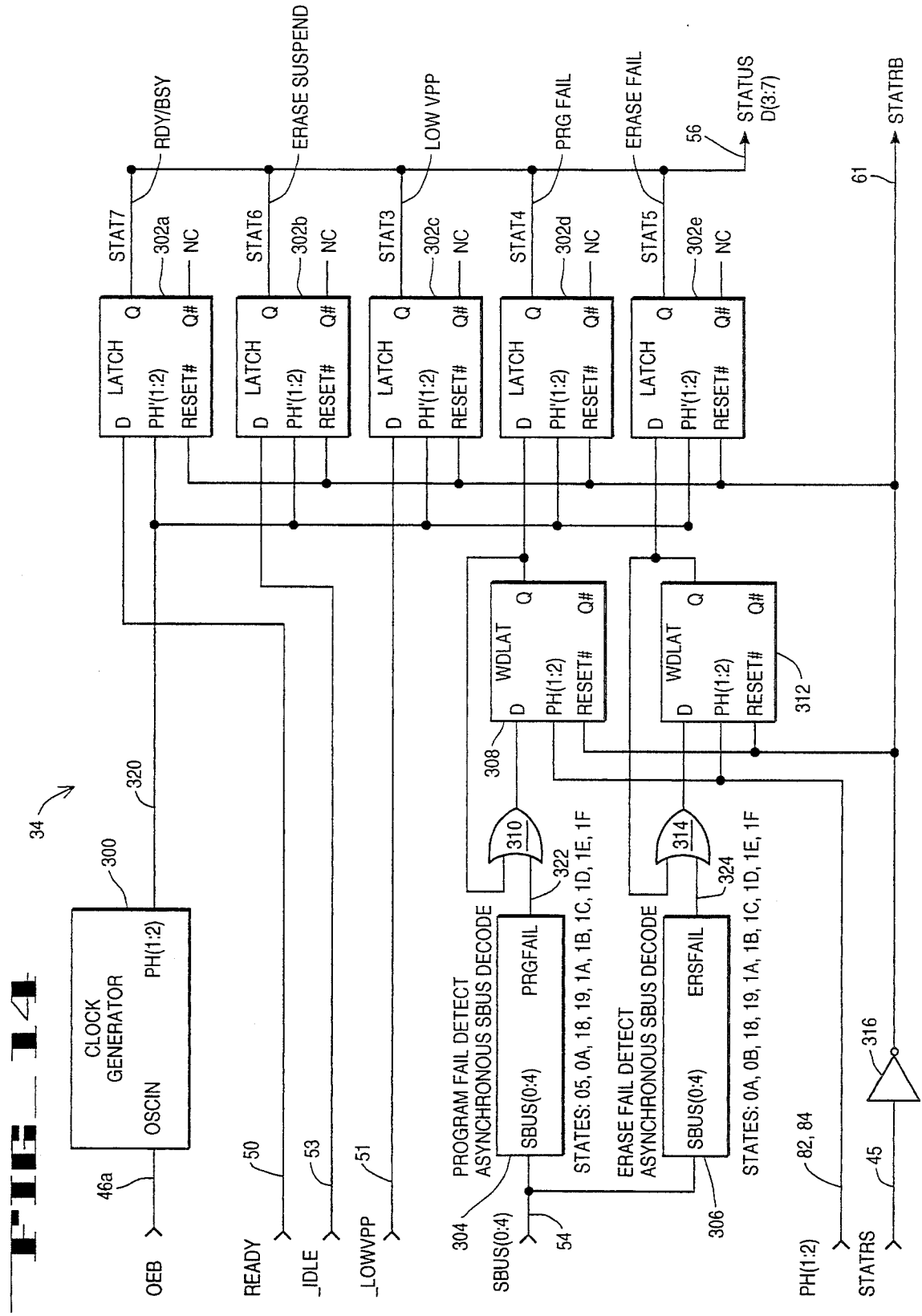

FIG_15

| ADDRESS LATCH BITS | REGISTER ADDRESS (APPLIED VIA ADDRESS PINS A(4:7)) |
|---|---|
| A(0:3) | 09H |
| A(4:7) | 0AH |
| A(8:11) | 0BH |
| A(12:16) | 0CH |

FIG_17

| | | TEST MODE BIT | |
|---|---|---|---|
| NAME | REGISTER ADDRESS (A4:7) | BIT ADDRESS (DATA PIN) | FUNCTION |
| ADJEC 0 | 1011 | 6 | ADJUSTS EVENT COUNTER TO 0 PULSES |
| ADJEC 1 | 1011 | 7 | ADJUSTS EVENT COUNTER TO 1 PULSE |
| NOPREC | 1011 | 3 | PREVENTS PRECONDITIONING |
| ISOSM | 1100 | 3 | ISOLATES NSL FROM WSM |
| DISOSC | 1001 | 6 | DISONNECTS OSCILLATOR |
| NST | 1011 | 4 | CONNECTS PCTR OUTPUTS TO NSL INPUTS |
| RSTOVERIDE | 1011 | 5 | OVERRIDES RESET |

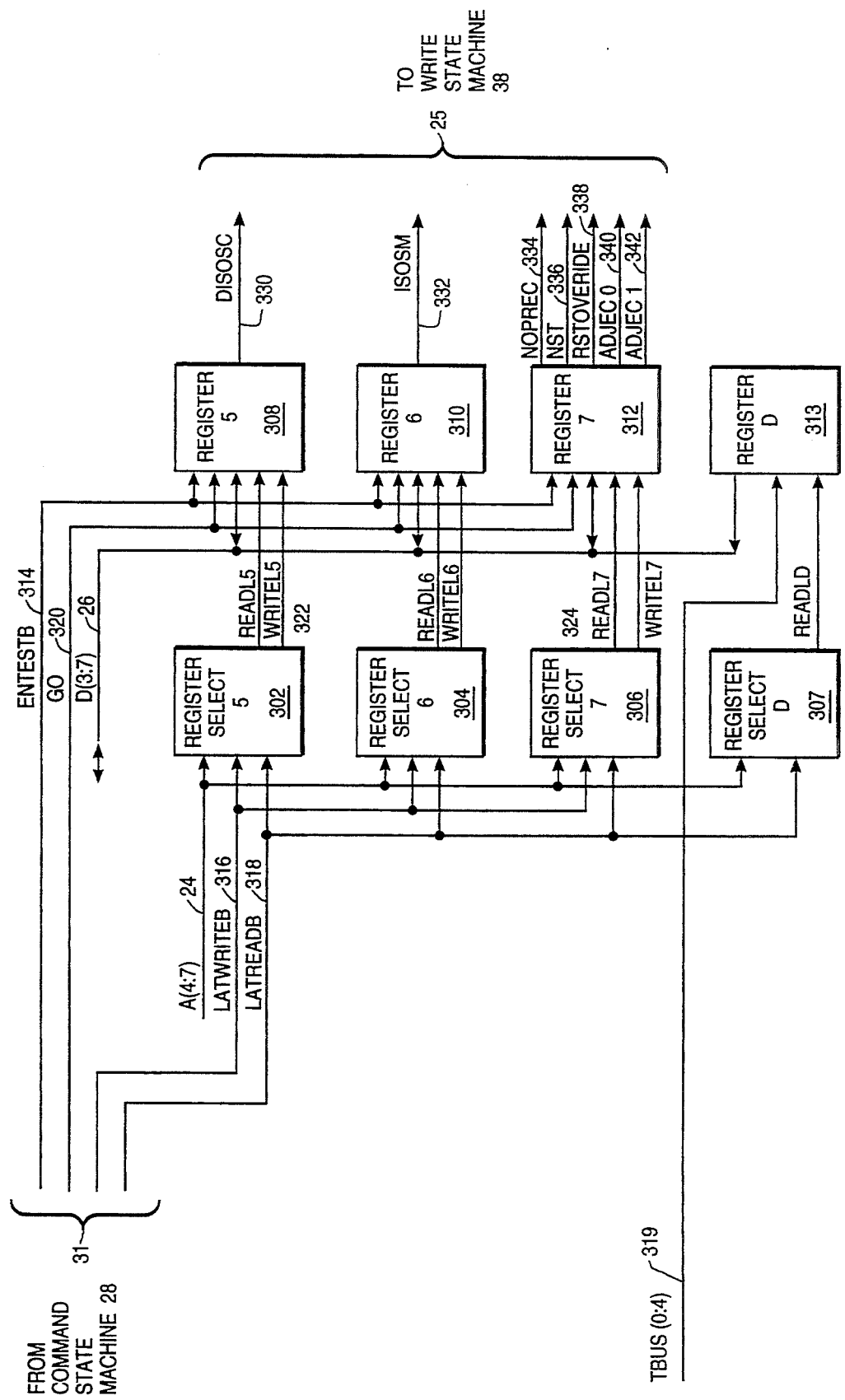

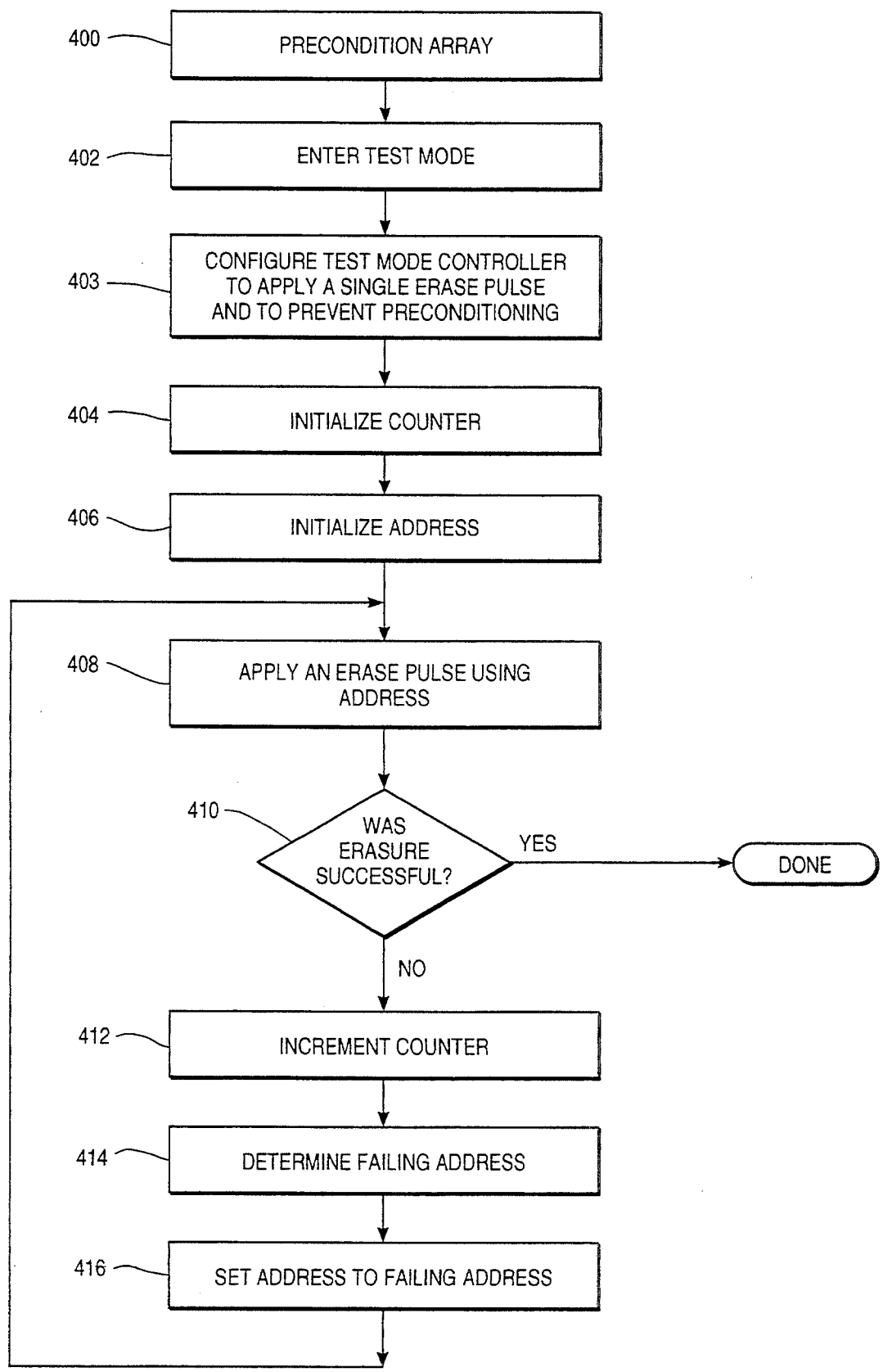

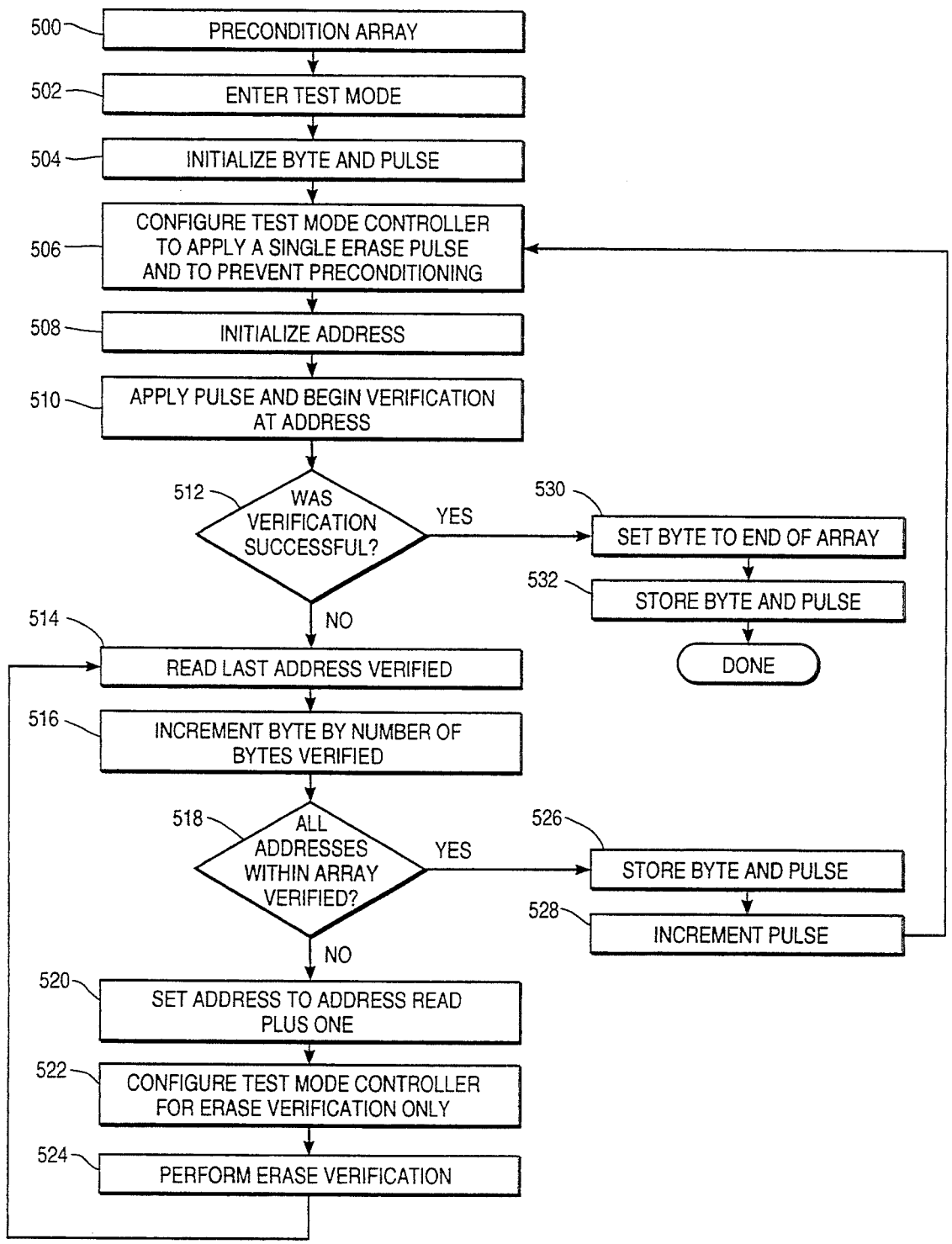

METHOD FOR TESTING ERASE CHARACTERISTICS OF A FLASH MEMORY ARRAY

This is a continuation of application Ser. No. 08/801,953, filed Dec. 03, 1991 now abandoned.

RELATED APPLICATION

This application is related to U.S. Ser. No. 7/654,375, filed Feb. 11, 1991, now abandoned.

FIELD OF THE INVENTION

The present invention relates to a method for testing a flash memory. More particularly, the present invention relates to a method of determining the erase characteristics of a flash memory that utilizes a write state machine.

BACKGROUND OF THE INVENTION

One type of prior non-volatile semiconductor memory is the flash electrically erasable programmable read-only memory ("flash EEPROM"). The flash EEPROM can be programmed by a user, and once programmed, the flash EEPROM retains its data until erased. After erasure, the flash EEPROM may be programmed with new code or data.

Flash memories differ from conventional electrically erasable programmable read only memory ("EEPROMs") with respect to erasure. Conventional EEPROMs typically use a select transistor for individual byte erase control. Flash memories, on the other hand, typically achieve much higher density with single transistor cells. During one prior art flash memory erase method, a high voltage is supplied to the sources of every memory cell in a memory array simultaneously. This results in a full array erasure.

For one prior flash EEPROM, a logical "one" means that few if any electrons are stored on a floating gate associated with a bit cell. A logical "zero" means that many electrons are stored on the floating gate associated with the bit cell. Erasure of the prior flash memory causes a logical one to be stored in each bit cell. Each single bit cell of the flash memory cannot be overwritten from a logical zero to a logical one without a prior erasure. Each single bit cell of the flash memory can, however, be overwritten from a logical one to a logical zero, given that this entails simply adding electrons to a floating gate that contains the intrinsic number of electrons associated with the erased state.

One prior flash EEPROM is the 28F256 complementary metal oxide semiconductor ("CMOS") flash memory sold by Intel Corporation of Santa Clara, Calif., which is a 256 kilobit flash EEPROM. The 28F256 flash memory includes a command register to manage electrical erasure and reprogramming. Commands are written to the command register from a controlling microprocessor using standard microprocessor write timings. The command register contents serve as input to an internal state machine that controls erase and programming circuitry.

A controlling microprocessor controls the erasure and programming of the flash memory. A prior Quick-Erase TM algorithm of Intel Corporation can be used by a microprocessor to erase the flash memory. The prior Quick-Erase TM algorithm requires that all bits first be programmed to their charged state, which is data equal to 00 (hexidecimal). Erasure then proceeds by pulling the source of the transistors in the array up to a high voltage level for a period of 10 msec, while keeping the transistor gates at zero volts. After each erase operation, erase verification of each byte is performed. The prior Quick-Erase TM algorithm allows up to 3000 erase operations per byte prior to recognition of erase failure. Proper device operation requires that the erasure procedure be strictly followed.

The prior Quick-Pulse Programming TM algorithm of Intel Corporation can be used by a microprocessor to program the flash memory. The Quick-Pulse Programming TM algorithm requires that a programming pulse of a specific duration and voltage level be applied to the program power supply Vpp and the device power supply Vcc. For example, for certain prior Intel flash memories a programming pulse of 10 $\mu$sec has been suggested while Vpp is held at 12.75. After the programming pulse is applied, the user must verify whether the memory cell addressed is properly programmed. If not properly programmed, a programming pulse may be reapplied a number of times before a programming error is recognized. Intel's Quick-Pulse Programming TM algorithm allows up to 25 programming operations per byte. Proper and reliable operation of the flash memory mandates that the programming procedure be strictly followed.

One disadvantage of the prior way of using a microprocessor to control erasure and programming of the flash memory is that it ties up the microprocessor, thus requiring a relatively high level of microprocessor overhead. This, in turn, decreases system throughput.

Another disadvantage of the prior way of using a controlling microprocessor to control the erasure and programming of the flash memory is the relatively high complexity of typical erasure/programming software. This complex software requires a relatively high level of user sophistication. Moreover, this complex software increases the likelihood of a customer error, such as over-erasure of the flash memory.

Further, the prior method of controlling erasure and programming is quite cumbersome and lengthy during production testing of the flash memory. Determining the number of pulses required to completely erase the array is time consuming and requires additional circuitry to verify erasure.

SUMMARY AND OBJECTS OF THE INVENTION

A method of determining erasure characteristics of a flash memory array using an on-board write state machine is described. Testing begins by configuring the write state machine to apply a single erase pulse to the array and then issuing an erase command. If array erasure is unsuccessful, another erase command is issued. Erase commands are reissued until every address within the array is successfully erased.

Another method is also described for determining the number of bytes within the array that erase in response to each erase pulse. Again, testing begins by configuring the write state machine to apply a single erase pulse to the array and issuing an erase command. Next, the number of bytes within the array that erased is determined. If not every byte within the array has been erased, erase verification continues by reconfiguring the write state machine. Another erase command is issued. Erase verification continues until every byte within the array has been erase verified. The application of a single erase pulse and erase verification of the entire array continues until every byte within the array is successfully erased.

An object of the present invention is to decrease the time necessary during production testing to verify the erase characteristics of a flash memory array Another object of the present invention is to provide a means of testing the erase characteristics of a flash memory that does not require external verify circuitry.

Another object of the present invention is to provide a means of verifying the operation of the write state machine on board a flash memory without effecting the memory array.

Other objects, features, and advantages of the present invention will be apparent from the accompanying drawings and the detailed description that follows.

BRIEF DESCRIPTION OF DRAWINGS

The present invention is illustrated by way of example in the figures of the accompanying drawings in which like references indicate like elements and in which:

FIG. 1 is a block diagram of circuitry of a flash memory, including a write state machine;

FIG. 2 depicts Table I, which lists flash memory commands;

FIG. 3 is a block diagram of the write state machine;

FIG. 4 is a block diagram of the circuitry of next state controller;

FIGS. 5A and 5B are is a state diagram of the method of programming and erasing flash memories;

FIG. 6 depicts Table II, which lists SBUS values for each write state machine state;

FIG. 7 depicts Table III, which lists is a table of signal names;

FIG. 8 is a block diagram of the circuitry of the oscillator and phase generator;

FIG. 9 is a start-up timing diagram for PH1 and PH2;

FIG. 10 is a block diagram of the circuitry of the period counter;

FIG. 11 is a block diagram of the circuitry of the event counter;

FIG. 12 is a block diagram of the circuitry of the address counter;

FIG. 13 is a block diagram of the circuitry of the data latch and comparator;

FIG. 14 is a block diagram of the status register;

FIG. 15 depicts Table IV, which lists read only test bit mode bit addresses;

FIG. 16 is a block diagram of the test mode controller;

FIG. 17 depicts Table V, which lists writable test register addresses;

FIG. 18 is a flow diagram of an erase test;

FIG. 19 is a flow diagram of another erase test.

DETAILED DESCRIPTION

Described herein is a method for determining erase characteristics of a flash memory incorporating an internal write state machine, which automatically controls programming and erasure of the array. The method of the present invention allows some external control of programming and erasure despite the presence of the write state machine. External control obtained by modifying the write state machine and the addition of a test mode controller.

Knowledge of the write state machine ("WSM"), which automatically programs and erases the flash memory array, is helpful to an understanding of the present invention. Thus, the write state machine is described in detail in Section I. Throughout Section I little mention is made of those portions of the write state machine required to test the memory array, even though these portions are illustrated in the referenced drawings. Those portions will be explained in Section II, which describes the present invention.

I. NORMAL OPERATION OF THE WRITE STATE MACHINE

FIG. 1 illustrates in block diagram form the circuitry of flash EPROM 20, which is a preferred embodiment of the present invention. Flash EPROM 20 is also referred to as flash memory 20.

As described in more detail below, flash EPROM 20 includes write state circuitry 32. Write state circuitry 32 sequences the nonvolatile semiconductor memory 20 through multi-step sequences to program or erase memory contents as desired with only an initiating command from microprocessor 999. Once a program or erase sequence is initiated, write state machine 32 controls programming and erasure. Status register 34 indicates to the microprocessor 999 when program and erase operations have been completed.

Vpp 36 is the erase/program power supply voltage for the flash memory. Vcc is the device power supply for flash memory 20 and Vss is ground. In one embodiment, Vpp 36 is 12.0 volts and Vcc is approximately 5 volts.

In the absence of high voltage on Vpp 36, flash memory 20 acts as a read-only memory. The data stored at an address supplied via lines 24 is read from memory array 22 and made available via data input/output lines 26 to the circuitry external to the flash memory 20.

Flash memory 20 has three control signals: chip-enable bar CEB 44, WEB 46, and output-enable bar OEB 42. The chip-enable bar CEB 44 input is the power control and is used to select flash memory 20. CEB 44 is active low. The output-enable bar input OEB 42 is the output control for flash memory 20 and is used to gate data from the output pins from flash memory 20. OEB 42 is active low. Both control signals CEB 44 and OEB 42 must be logically active to obtain data at the data lines 26 of flash memory 20.

The write enable bar signal, WEB 46, allows writes to command state machine 28 while CEB 44 is low. Write enable bar signal 46 is active low. Addresses and data are latched on the rising edge of WEB 46. Standard microprocessor timings are used.

Device operations are selected by writing specific data patterns into the flash memory via data input/output lines 26. FIG. 2 defines certain commands.

SRD in FIG. 2 represents data read from the status register 34. PA in FIG. 2 represents the address of the memory location to be programmed and PD represents the data to be programmed at address PA.

Erase is executed on an entire array 22 of FIG. 1 and initiated by a two-cycle command sequence. An erase-setup command is first written, followed by the erase-confirm command. Array preconditioning, erase and erase verification are all handled internally by the write state machine, invisible to the microprocessor 999. The erase operation takes approximately 1 second.

This two step erase, set-up followed by execution, ensures that memory contents are not accidentally erased. Erasure can occur only when high voltage is applied to Vpp. In the absence of this high voltage, the memory contents are protected against erasure.

The erase event involves two major tasks: preconditioning and erasing. Preconditioning the array 22 by bringing cell voltages to approximately 6.75 volts protects the longevity of the array 22 by preventing cell voltages during erasure from dropping to levels that could result in cell leakage. Array erasure brings cell voltages to approximately 3.25 volts, a logic 1.

The microprocessor 999 can detect the completion of the erase event by issuing a Read Status Register command and analyzing the status data. When the status register 34 indicates that erase is complete, the erase failure status bit should be checked. After examination the status register 34 error bits should be cleared as appropriate. Further operation can occur only after giving the appropriate command.

Programming is also executed by a two-cycle command sequence. The Program Set-up command is written to the command state machine 28 via data lines 26, followed by a second write command specifying the address and data to be programmed. The write state machine 32 then takes over, controlling the program and verify algorithms internally. Polling the status register 34 with the Status Register Read command will determine when the programming sequence is complete. Only the Read Status Register command is valid while programming is active.

When the status register 34 indicates that programming is complete, the program fail bit should be checked. After examination, the microprocessor 999 should clear the status register error bits as appropriate.

In a preferred embodiment, the circuitry of flash memory 20 shown in FIG. 1 is on a single substrate. In a preferred embodiment, flash memory 20 employs CMOS circuitry.

Flash memory 20 includes a memory array 22, which includes memory cells that store data at addresses. In addition, flash memory 20 includes on-chip command state machine ("CSM") 28, synchronizer 30, write state machine ("WSM") 32 and status register 34.

Commands to program or erase memory array 22 are applied via data lines 26. The data on lines 26 is passed on to command state machine 28. The command state machine 28 decodes the data and if it represents an erase, program or status register reset command, the CSM 28 begins generating the appropriate control signals. The control signals provided by the command state machine 28 to the write state machine 32 include PROGRAM 38, ERASE 40, status register reset signal STATRS 45, address latch enable ALE 49, and data latch enable signal DLE 47.

The program and erase algorithms are regulated by the write state machine 32, including program pulse repetition where required and internal verification of data, as will be discussed in detail herein below.

Write state machine 32 latches in the necessary address and data needed to complete erase and program operations from inputs A[0:16] 24 and D[0:7] 26. The operation of the write state machine's address and data latches is controlled respectively by address latch enable signal ALE 49 and data latch enable signal DLE 47 from the CSM 28.

The write state machine 32 interfaces with memory array 22 via array address signals AY 55 and AX 57 and sense amp outputs SOUT[0:7] 59, which represent the data stored at the addressed memory byte.

Write state machine 32 reports its status during operation to synchronizer 30 and status register 34 via SBUS[0:4] outputs 54.

The synchronizer 30 provides synchronization between the write state machine 32 and the command state machine 28. Upon receipt of either an active ERASE 38 or PROGRAM 40 signal, synchronizer 30 forces the READY signal 50 to a logic low, indicating to the command state machine 28 and the status register 34 that the write state machine 32 is busy. When the write state machine 32 completes its operation, synchronizer 30 shuts down the write state machine 32 by setting READY.

The synchronizer 30 resets the write state machine 32 whenever ERASE 38 and PROGRAM 40 goes to a logic low by forcing RESET signal 52 to a logic high.

The synchronizer 30 also reports to the status register, providing information about the status of write state machine 32 operation via signals LOWVPP 51.

The status register 34 decodes the SBUS[0:4] outputs 54 and indicates to the microprocessor 999 whether the task is complete or not and its success via STATUS outputs 56. STATUS outputs 56 are multiplexed onto the input/output data lines, DATA[0:7] 26.

Test mode controller 29 will be discussed in detail in Section II. Test mode controller does not affect normal programming and erasure.

FIG. 3 illustrates in block diagram form the circuitry of write state machine 32 and its connection to the status register 34. The write state machine 32 includes an oscillator and generator 70, a next state controller 72, an event counter 74, a period counter 76, an address counter 78 and a data latch and comparator ("DLC") 80.

RESET 52 is applied to nearly all circuits within the write state machine 32. RESET 52 forces critical nodes within the write state machine 32 to known states. For example, RESET 52 forces to a logic zero the terminal count signals 88, 90 and 92.

Shortly after receiving an inactive RESET signal 52, the oscillator/phase generator 70 begins generating two non-overlapping phase clocks, phase 1 PH1 82 and phase 2 PH2 84, which are routed to nearly all of the WSM 32 circuitry. PH2 84 is the first clock active after RESET 52.

Next state controller 72 controls and coordinates the activities of the write state machine 32 and determines the WSM's next state. Next state controller 72 generates the five outputs SBUS[0:4] 54, which indicate the WSM's current state.

Next state controller 72 receives a number of test mode inputs, NOPREC, NST, ISOSM and PVAL(0:14), which do not affect normal programming and erasure while they are inactive. The behavior of next state controller 72 in response to these signals will be discussed in Section II. Similarly, other test mode inputs to the remainder of the WSM will be discussed in Section II.

Each circuit receiving SBUS[0:4] 54 from the next state controller 72 performs its own SBUS[0:4] 54 decode to determine its next task. This design allows many tasks to be performed in parallel, minimizing the time needed it takes to perform erase and program functions.

The period counter 76 determines and times the pulse periods for array voltages during program and erase operations. Another period indicated by period counter 76 is the delay between programming or erasing and verification of valid data from memory cells. By going active-high, the period counter's 76 terminal count signal PCTRTC 88 informs the next state controller 72 that the selected period of time has elapsed.

The period counter 76 decodes SBUS[0:4] 54 to select the desired pulse period. SBUS[0:4] 54 also causes the period counter 76 to reset its count one state before period counter 76 is to be enabled.

The event counter 74 determines when the maximum number of program or erase operations per byte has been reached. When the maximum number of operations per byte has been reached, the event counters 74 informs the next state controller 72 by bringing the event terminal count signal, ECTRTC 90, to a logic high. The event counter 74 determines the maximum number of operations by decoding the SBUS[0:4] outputs 54. In the preferred embodiment, the maximum number of program operations per byte is set to 50 and the maximum number of erase operations is set to 8192.

Within WSM 32, the address counter 78 functions as both an input buffer and a counter. When READY 50 is high the address at address lines A[0:I 6] is output as signals AY[0:6] 55 and AX[0:9] 57. Signals AY[0:6] 55 and AX[0:9] 57 point to the location of the byte in memory array 22 which is to be programmed, erased or read.

After the address has been input to the input buffers, the address from the input buffers will be loaded into the address counting circuitry under the control of CSM 28 via the signal ALE 49. The address counter 78 then counts through all the addresses in the memory array 20. The address counter 78 indicates to the next state controller 72 that the end of memory has been reached by forcing its terminal count signal ACTRTC 92, to a logic one.

The data latch and comparator (DLC) 80 is the interface between the WSM 32 and the command state machine 28, and memory array 22 and data lines 26. TTL data input on data lines 26 is buffered by the DLC 80 and passed on to the command state machine 28 as DATAIN[0:7] signals 27.

If the signal received on DATAIN[0:7] lines 27 represents a program command, the command state machine 28 will direct DLC 80 to store the information at data lines 26 by setting the data latch enable signal DLE 47 to a logic one. During the program operation, the DLC 80 compares the data stored in its latches to sense amp signals SOUT[0:7] 59 and indicates a match by setting MATCH 94 to a logic high.

The DLC 80 compares the sense amp signals, SOUT [0:7] 59, which are indicative of memory cell contents, to a reference logic level during erase verify procedures and indicates successful erasure to next state controller 72 by setting MATCH 94 to a logic high.

The status register 34 reports the status of the write state machine 32 to the microprocessor 999 via status signals STUTUS[3:7] 56, which are multiplexed onto data input/output lines 26. The status register 34 determines the write state machine's status based upon the signals READY 50, LOWVPP 51, and SBUS[0:4] 54.

FIG. 4 illustrates in block diagram form the circuitry of next state controller 72. Next state controller 72 includes next state logic 110 and a master slave D-latch 112. In the preferred embodiment, the next state logic 110 is implemented as a programmable logic array.

Next state logic 110 determines the next state of each circuit within the write state machine 32 based upon the write state machine's previous state, as represented by signals PLOUT[0:4] 114, the terminal count signals, PCTRC 88, ECTRTC 90 and ACTRC 92, MATCH 94, PROGRAM 38 and ERASE 40. Each circuit providing an input to the next state logic 1 does so by the next active PH2 84 following the SBUS[0:4] active. They are able to do so because all circuits within the the write state machine 32 are master/slave with the output valid on PH2 84.

The output of next state logic 110 is latched into latch 112 and provided to the rest of the write state machine circuitry as SBUS[0:4] 54.

Status bus outputs SBUS[0:4] 54 become active on the second PH2 84 rising edge after RESET 52 is cleared. As a result of SBUS[0:4] 54 being PH2 84 active, each WSM 32 circuit evaluates SBUS[0:4] 54 while PH1 82 is high.

The method of programming and erasing implemented by next state controller 72 can be understood with reference to the state diagram of FIG. 5.

In FIGS. 5A and 5B, each bubble represents a state of write state machine 32. The name of each state is indicated on the top line of each bubble. The unique SBUS[0:4] 54 value for each state is indicated below the state name. The signals which are selected or enabled during each state are listed below the SBUS values. The combination of signals that cause the next state controller 72 to branch to another state are generally indicated in text beside each branch, with inactive signals preceded by an exclamation point "!" It will be understood that next state controller 72 branches from one state to another state regardless of the inputs to next state controller 72 when no combination of signals is indicated next to a branch.

Branches not mentioned in the following discussion, i.e. branches 1000, 1001, and 1004 relate to test modes and will be discussed later in Section II.

When power is first applied to flash memory 20, the next state controller 72 is held in the POWER_UP state 120 by RESET 52. No events occur in this state, and the next state controller 72 simply begins execution after an active PROGRAM 38 or ERASE 40 is received from the command state machine 28.

Assume that after power-up, next state controller 72 receives an active PROGRAM 38 signal and an active ERASE 40 signal, as indicated by branch 122. These input signals cause the next state controller 72 to branch to the HARDWARE_ERR state 124.

In the HARDWARE_ERR state 124, the status register's 34 two fail bits, PRG_ERR and ERASE_ERR are set to a logic high, indicating a hardware failure. From state 124, the write state machine 32 branches back to the POWER-UP state 120, regardless of the input signals to next state controller 72.

Assume that after entering state 120, the next state controller 72 receives an active PROGRAM signal 38 and an inactive ERASE signal 40. This combination of signals initiates a program event, which will be performed on the byte indicated by address lines 24. The indicated byte will be programmed substantially to the value indicated on the data lines 26. In this situation, the next state controller 72 takes branch 126 to the PROG_SETUP state 132.

In the PROG_SETUP state 132, the next state machine 72 is configured for a program event. In state 132 the period counter 76 is reset and the event counter's 74 program count is selected. The program path in memory array 22 is set-up. Afterwards, the next state controller 72 takes branch 134 to the PROGRAM state 136.

In state 136, the byte indicated by the signals AY[0:6] 55 and AX[0:9] 57 is programmed to a voltage level of approximately 6.75 volts, a logic 0. During state 136, the period counter 76 is configured for a program operation by selecting its program period. The write state machine 32 remains in state 136 until the period counter 72 reaches its terminal count, indicating that the program voltage has been applied for a sufficient period of time to bring the byte voltages to 6.75 volts.

The next state controller 72 takes branch 138 to the program equalization state PROG_EQ 140 when PCTRTC 88 becomes active, a logic high.

Events during state 140 prepare the write state machine 32 and the array to perform program verification, i.e. to determine whether the previous program operation was successful. In state 140 the period counter 76 is reset and the event counter 74 is enabled, allowing it to increment its count. The array 22 is enabled, allowing a byte to be read, and the program verify circuitry within the array 22 is turned on.

Now partially configured to perform program verification, next state controller 72 branches from state 140 to the PROG_VER_DELAY state 142. In state 142, the write state machine 32 verifies that the addressed byte has been successfully programmed by comparing the signal SOUT[0:7] to the program data stored in the DLC 80. The period counter 76 provides a verification delay to ensure that SOUT[0:7] 59 is valid before verification is performed.

The array 22 is configured for program verification by enabling the word lines and turning on the read path of memory array 22. The DLC 80 is configured to perform program verification by bringing the signal CMPEN 287 active and bringing the signal PGVER 285 active. When active, the PGVER signal 285 allows the DLC 80 to indicate a match even when the microprocessor 999 has attempted to erase a programmed bit during a program operation. The effect of CMPEN 287 and PRGVER 285 will be discussed in more detail below with respect to the DLC 80 block diagram of FIG. 13.

During state 142, the program count of the event counter 74 remains selected, maintaining the event counter in the program event mode.

When PCTRTC 88 becomes active, the next state controller 72 examines MATCH 94 to determine whether the addressed byte has been successfully programmed. MATCH 94 will be a logic 1 if the byte has been successfully programmed and a logic 0 if it has not.

Given that the microprocessor 999 requested a program operation, the next state controller 72 can take only two of the three branches out of state 142.

Next state controller 72 takes branch 144 back to the PROGRAM-SETUP state 132 if the previous program operation was not successful and the event counter 74 has not exceeded the maximum program event count. The write state machine 32 cycles through states 132, 136, 140, and 142 until the byte is successfully programmed or the event counter 74 times out, whichever occurs first.

When the event counter 74 times out or the byte has been successfully programmed, next state controller 72 takes branch 146 to the first program done state PROG_DONE 1" 148. No events occur in state 148.

The next state controller 72 branches to the PROG_DONE2 state 150 from state 148. Again, no events occur.

During a program event next state controller 72 can only take three branches 152, 154, or 159 out of state 150.

Next state controller 72 takes branch 159 to state 124 when the next state controller 72 receives any illegal SBUS state assignment. In the HARDWARE_ERR state 159 both the PRG_ERR and ERASE_ERR bits of the status register are set. The next state logic 72 thereafter branches to state 120 from state 159 and the program event ends in a hardware failure.

Table III, illustrated in FIG. 6, includes SBUS values for states that are mapped as hardware errors. Table IV, illustrated in FIG. 7, gives the names for the signal acronyms used in FIG. 6.

If the program operation has failed the next state controller 72 takes branch 152 to the PROG_FAIL state 160 from state 150. In the PROG-FAIL state 160 the status register's 34 program fail bit PRG_ERR is set. Afterward, next state controller 72 branches back to the POWER-UP state 120. Again the program event ends as a failure.

If, on the other hand, the program operation has been successful, then next state controller 72 takes branch 154 directly to state 120 from state 150. In this instance the program event is successfully completed.

The erasing of memory array 22 is initiated by receipt of an active ERASE signal 38 and an inactive PROGRAM signal 40 while in the POWER_UP state 120. This combination of signals initiates an erase event and causes next state controller 72 to take branch 162 to the ERASE state 164.

In ERASE state 164 next state controller 72 initializes the write state machine 32 for array preconditioning by resetting the address, period, and event counters 78, 76, and 74.

From ERASE state 160 next state controller 72 branches to state 132 and begins array 22 preconditioning; i.e. programming each bit, to a logic 0 prior to erasing the array.

During an erase operation next state controller 72 will cycle through states 132, 136 and 140 as described herein above with respect to program operations.

Differences between erase and program operations appear in the possible branches out of the PROG_VER_DELAY state 142. These differences occur, in part, because programming occurs a byte at a time while erasure occurs for the entire array. The additional possible states in an erase event cycle the address counter through each byte in the array.

Next state controller 72 branches to the PROG_INC_ADD state 166 from state 142 if the addressed byte has been successfully preconditioned. In the PROG_INC_ADD state 166 events prepare the write state machine 32 to precondition another byte of memory array 22. Address counter 78 is enabled, allowing its count to be incremented, thereby pointing to a new address within the array 22. The event counter 74 is reset and its program count selected. The program verify signal enables memory array 22 and its sense amps.

Next state controller 72 branches from state 166 back to the PROG_SETUP state 132, unless the address counter 78 has reached it terminal count.

The write state machine 32 cycles through states 132, 136, 140, 142 and 166 until every byte of the memory array 22 is preconditioned or a byte cannot be successfully preconditioned.

If a byte cannot be successfully preconditioned the next state controller 72 branches to PROG_DONE1 state 148 from PROG_VER_DELAY state 142. No events occur in state 148 and next state controller 72 branches to PROG_DONE2 state 150.

During an erase operation, next state controller 72 can take only three branches 156, 158 or 159 out of state 150.

The next state controller 72 takes branch 156 to the ERASE_FAIL state 168 when a byte has not been successfully preconditioned by the time the event counter 74 has reached its terminal count. In state 168 the ERASE_ERR bit is set. From state 168 next state controller 72 returns to the POWER_UP state 120. Thus, the erase operation ends unsuccessfully.

If, on the other hand, all bytes have been successfully preconditioned the next state controller 72 takes branch 158 to the ERASE_SETUP1 state 170 from state 150. The next state controller 72 then begins the process of erasing the array 22; i.e., bringing the cell voltages to approximately 3.25 volts.

In state 170 the address counter 78 and event counter 74 are reset. These actions prepare the write state circuitry 32 and the array 22 for erasure.

From state 170 next state controller 72 branches to ERASE_SETUP2 state 172. Events during state 172 further prepare the WSM 32 for erasing the array 22. In state 172 the SBUS decodes cause the period counter 76 to be reset and the erase verify circuitry within the memory array 22 to turn on.

The next state controller 72 branches to the APPLY_ERASE state 176 from state 172. During state 176 the erase voltage is applied to the array until the period counter 76 reaches its terminal count. Next state controller 72 advances from state 176 to the ERASE OFF state 178 when PCTRTC 88 becomes active.

In anticipation of erase verification procedures, in state 178 the period counter 76 is reset. The event counter 74 is enabled, allowing it to increment its count and the memory array 22 read lines continue to be enabled, allowing access to read memory contents. The erase verify circuitry remains turned on.

Next state controller 72 branches to state 180 from state 178.

During the ERASE_VERIFY state 180 the write state machine 32 determines whether the indicated byte of memory has been successfully erased. The events in state 180 configure the WSM 32 to perform the verification, and also execute the verification. During state 180 the period counter 76 is reset and its erase verification delay selected. The erase verification delay is approximately the time between when the erase voltage is removed and the SOUT[0:7] signals 59 are valid.

In state 180, the DLC 80 circuitry is configured to verify that the addressed byte has been successfully erased by setting the signal COMPDAT 283 to a logic one and bringing the signal CMPEN 287 active. The signals COMPDAT 283 and CMPEN 287 and the DLC 80 circuitry will be discussed in more detail herein below.

During state 180, the array's read path is turned on and the array is enabled, allowing array 22 to provide outputs SOUT[0:7] 59 to the DLC 80.

After the period counter 76 times out, the next state controller 72 determines whether the erase operation has been successful by examining the MATCH signal 94. MATCH 94 is a logic one when the byte has been successfully erased and is a logic zero when it has not.

Next state controller 72 branches to state 172 from state 180 to apply another erase pulse if MATCH 94 indicates that the byte currently addressed has not been successfully erased and the event and address counters 74 and 78 have not reached their terminal counts. The write state machine 32 cycles through states 172, 176 and 180 until the event counter 74 times out or the erasure of the addressed byte is successfully verified.

Next state controller 72 takes branch 182 to the ERASE_FAIL state 168 if a memory byte is not successfully erased after the event counter 74 reaches its terminal count. In state 168 the ERASE_ERR bit is set. Thereafter, the write state machine 32 branches back to state 120. Thus, the erase sequence ends unsuccessfully.

The next state controller 72 branches to the ERASE_INC_ADD state 184 from state 180 when a byte is successfully verified and not every byte in the array has been erased, as indicated by an inactive ACTRTC signal 92. In state 184 the address counter 78 is enabled, allowing it to increment its count and allowing signals AY 55 and AX 57 to point to another byte in array 22. In state 184, the memory array 22 and the DLC 80 are readied to perform another verify operation by bringing CMPEN 287 active, enabling the array 22 and turning on the array read path and the erase verify circuitry.

After pointing to a new byte within the array 22, the write state machine 32 compares the current byte value to the desired value to determine whether erasure of the indicated byte is necessary. These events occur in states 180, 184 and 186.

The next state controller 72 branches to the ERASE_INC_DELAY state 186 from state 184. State 186 provides a small delay before an erase verify operation is performed. In state 186 the DLC 80 is maintained in its erase-verify configuration by keeping COMPDAT 283 set to logic 1 and COMPEN 287 active. The memory array 22 continues to be enabled, and the read path and erase verify circuitry remain on.

From state 186 the write state machine 32 branches back to the ERASE_VERIFY state 180. The DLC 80 compares the contents of the current memory location to erase voltage levels. If verification indicates that the byte is already erased, next state controller 72 will cycle through states 184, 186 and 180 until an unerased byte is located in the memory array 22 or until the address counter 78 reaches its terminal count.

The next state controller 72 branches back to state 172 from ERASE_VERIFY state 180 when an unerased memory location is reached and the address counter 78 has not yet reached its terminal count. Write state machine 32 will cycle through states 172, 176, 178, 180, 184, and 186 as described above until the end of the memory array 22 is reached or a byte cannot be successfully erased.

When every byte has been successfully erased, as indicated by ACTRTC 92 active, next state controller 72 takes branch 188 to the POWER_UP state 120. The erasure of the array 22 is thus successfully completed.

FIG. 8 illustrates in block diagram the oscillator and phase Generator 70. Test mode signals and modifications are shown, but will be discussed in Section II. Oscillator 200 begins operating upon receipt of an inactive RESET signal 52. The oscillator 200 runs as long as RESET 52 is inactive. When RESET 52 is asserted the oscillator 200 ceases to run.

The oscillator's output 202 is provided to the phase generator 204. The phase generator 204 includes a two-bit shift register that is held inactive until activated. The shift register shifts through 4 combinations—namely, "00," "01," "11," and "10." Two decoders of phase generator 204 watch for the "01" and "10" states and generate two out clocks—namely, PH1 82 and PH2 84, respectively, which are routed to nearly all of the WSM 32 circuitry.

In the preferred embodiment, PH1/PH2 82 and 84 have a typical cycle time of 500 ns. The duty cycle of both PH1 82 and PH2 84 is approximately 25%.

The start-up timing for PH1 82 and PH2 84 in relation to RESET 52 and SBUS[0:4] 54 can be seen in FIG. 9. RESET 52 goes low on the rising edge of either PROGRAM 38 or ERASE 40. After RESET 52 falls PH2 84 is the first clock to go active high.

SBUS[0:4] 54 becomes active on the rising edge of the second PH2 84 pulse; all WSM 32 circuitry evaluates SBUS[0:4] 54 during PH1 82 active to guarantee valid readings.

FIG. 10 illustrates in block diagram form the period counter 76. The period counter 76 includes a period counter SBUS decoder 21 0, a 15 bit shift register counter 212, a terminal count match circuit 214, and a latch 216.

The period counter SBUS decoder 210 controls the counter 212 and the terminal count match circuit 214. Decoder 210 decodes SBUS signals 54 and determines whether the counter's 21 2 count should be reset and selects among the three possible terminal counts.

The operation of SBUS decoder 210 in each state can be determined with reference to FIG. 6. For example, FIG. 6 indicates that in the APPLY ERASE state 176, that the SBUS decoder 210 selects the erase terminal count by setting PCTSELERS to a logic 1. The operation of SBUS decoder 210 while RSTOVERIDE is active will be discussed in Section II.

SBUS decoder 210 is implemented as random logic in the preferred embodiment.

The shift register counter 21 2 does not incorporate a counter enable and thus continues to run in all states except for those in which it is reset by an active PCTRST signal 218.

The Q outputs 220 of the shift register 21 2 are fed to the terminal count match circuit 21 4. Terminal count match circuit 214 analyzes Q outputs 220 and indicates when a selected terminal count is reached. The terminal count match circuit recognizes three possible terminal counts: erase, program, and verify, which are selected by active signals PCTSELERS, PCTSELPGM, and PCTSELVER, respectively.

Approximate time periods are 10 μsec for programming operation, 10 msec for erase operations, and 3 μsec for verification operations.

Output TCOUNT 222 is active for only one state because the counter 212 continues to increment TCOUNT 222. To store the active terminal count TCOUNT 222 latch 216 is used in conjunction with OR gate 217.

Latch 21 6 is reset by RESET 52 when the write state machine 32 is first powered up, setting its Q output 224 to a logic 0. Latch 216 is also reset when the PCTRST 218 signal is asserted. When TCO UNT 222 goes active high, Q output 224 goes to a logic 1. Q output 224 keeps the latch's input at logic 1 after TCOUNT 222 goes inactive, thus keeping PCTRTC 88 at a logic 1 until latch 216 is reset by RESET 52.

FIG. 11 illustrates in block diagram form the event counter 74. The event counter 74 includes an event counter SBUS decoder 230, a thirteen bit counter 232, an event counter terminal count select circuit 234, a latch 236, and an OR gate 238.

The event counter SBUS decoder 230 controls the counter 232 and the terminal count match circuit 234. Decoder 230 decodes SBUS signals 54 and determines whether the counter's 232 should be enabled or reset, and selects between the the two possible event counter terminal counts.

The operation SBUS decoder 230 for each WSM state can be determined with reference to FIG. 6. For example, FIG. 6 indicates that in the ERASE_VERIFY state 180 SBUS decoder 230 selects the erase terminal count by setting ECTRER. The operation of SBUS decoder 230 while ADJEC0 and ADJEC1 are active will be discussed in Section II.

The event counter SBUS decoder 230 is implemented as random logic in the preferred embodiment.

The counter 232 is reset by the SBUS decoder 230 whenever the WSM 32 begins to program, precondition or erase a new byte. The ripple carry counter 232 increments its count only when enabled by an active ECTREN signal 240. The Q outputs 242 of counter 232 are fed to the event counter terminal count match circuit 234.

Event counter terminal count match circuit 234 analyzes Q outputs 242 and indicates when a selected terminal count is reached. The event counter terminal count match circuit 234 recognizes two possible terminal counts: namely, erase and program, which are selected by the signals ECTRE R and ECTRPG.

Event counter 74 allows over 8000 erase pulses to be applied when an erase event is selected and 50 program pulses to be applied when a program event is selected. TCOUNT 244 is latched in exactly the same fashion as TCOUNT 222 using latch 236 and OR gate 238.

FIG. 12 illustrates in block diagram form of the address counter 78. The address counter 78 includes TTL input buffers 250, 252 address counter SBUS decoders 254, 256, a 17 bit linear counter 258 and a bypass multiplexer 260. Test phase clock driver 261 will be discussed in Section II.

The buffers 250 and 252 convert the TTL address inputs A[0:I 6] 24 to CMOS levels. The buffer outputs AIN[0:I 6] 262 are applied to the bypass multiplexer 260 and the parallel Icad inputs of counter 258.

When the READY signal 50 is a logic high, the address counter 78 provides flow through addressing by selecting the buffered TTL outputs 262 as the outputs of bypass multiplexer 260.

The address counter SBUS decoders 254 and 256 control the operation of the counter 258. SBUS decoder 254 provides counter 258 with a reset signal ACTRRST 266. SBUS decoder 256 decodes SBUS[0:4] 54 to generate a counter enable signal ACTEN 268.

The operation of SBUS decoders 254 and 256 can be understood with reference to FIG. 6. For example, FIG. 6 indicates that SBUS decoder 256 enables counter 258 in the PROG_INC_ADD state 166 by bringing the signal ACTEN 268 to a logic 1.

The address counter's SBUS decoders 254 and 256 are implemented as random logic in the preferred embodiment.

The counter 258 is a 17 bit linear counter with parallel load and will not be described in detail herein.

During a program operation the address counter 78 operates as follows. Before the command state machine 28 issues a program command to the write state machine 32, the READY signal is a logic high indicating that write state machine 32 is ready to perform an operation. This selects the TTL buffer outputs 262 as the output of bypass multiplexer 260.

Prior to bringing signal PROGRAM 38 to an active condition, the command state machine 28 brings the address latch enable signal ALE 49 active. ALE 49 active loads the buffered address outputs AIN[0:1 6] 262 into the counter 258. Signals AQ 262 and AIN 264 will be the same value until the counter 258 is enabled and increments its count.

The bypass multiplexer 260 selects counter inputs AQ[0:16] as outputs when PROGRAM 38 becomes active. The multiplexer 260 selects AQ[0:I 6]by forcing READY 50 inactive. The counter 258 is not allowed to increment its count during a program operation, thus counter 258 acts as an address latch during program operations.

The operation of the address counter 28 during erase operations is initially similar to that during program operations. However, the counter 258 is enabled during erase operations in the PROG_INC_ADD state 166 and ERASE_INC_ADD state 184, allowing signals AY 55 and AX 57 to cycle through the addresses within memory array 22 until the end of the array 22 is reached, as indicated by ACTRTC 92 active.

FIG. 13 illustrates in block diagram form of the data latch and comparator circuit ("DLC") 80. The DLC 80 includes eight latch and comparator circuits 270a–270h, one for each data bit; DLC SBUS decoders 282, 284, and 286; an AND gate 288; a multiplexer 290; and a latch 292.

Microprocessor 999 writes commands to flash memory 20 via data lines DATA[0:7] 26, while holding CEB 44a and WEB 46 active. The active CEB signal 44a and active WEB signal 46 enable the TTL input buffers 272a–272h within each DLC latch and comparator circuit 270a–270h converting the data at lines 26 to CMOS signals DATAIN[0:7] 27.

The CSM brings data latch enable signal DLE 47 active if DATAIN[0:7] 27 represents a program or an erase command. When DLE 47 becomes active, the data from TTL buffers 272a–272h is clocked into latches 274a–274h. During program verification the latch and comparator circuits 270a–270h operate as follows. The ERASE signal 38 is inactive, selecting the 10 inputs of multiplexers' 276a–276h as the multiplexers' outputs. Thus, the data stored in latches 272a–272h is applied to the LAT inputs of comparators 278a–278h.

The comparator outputs 279a–279h indicate whether each bit of the program data matches the sense amp outputs SCUT[0:7] 59. For each comparator 278a–278h, if the two comparator inputs SOUT and LAT agree, the comparator output will be a logic one. If the comparator inputs do not agree, the output will be a logic 0.

During program verification, the operation of the comparators 278a–278h described above is modified by the active program verify signal PGVER 285. As can be seen from Table 1, when PGVER 283 is active, comparators 278a–278h output a logic 1 when the cell is at a logic 0 and the bit is desired to be a logic 1. The comparators 278a–278h indicate a match in this situation because the write state machine 32 cannot erase a programmed bit during a program operation.

TABLE 1

| | | MATCH OUTPUT | |
|---|---|---|---|
| SOUT | LAT | PGVER INACTIVE | PGVER ACTIVE |
| 0 | 0 | 1 | 1 |
| 0 | 1 | 0 | 1 |
| 1 | 0 | 0 | 0 |
| 1 | 1 | 1 | 1 |

The outputs 279a–279h of all the comparators 278a–278h are ANDed together by AND gate 288. The output of AND gate 288 is a logic 1 when each bit of SOUT[0:7] 59 and DATAIN [0:7] 27 match and a logic 0 when SOUT[0:7] and DATAIN [0:7] do not match.

The AND gate 288 output is applied to the I1 input of the output multiplexer 290. The I1 input of multiplexer 290 is selected as the multiplexer output by an active CMPEN signal 282.

CMPEN 287 is active during program verification, thus allowing the AND gate output 289 to flow through latch 292 and control the logic state of MATCH signal 94.

The value of MATCH 94 is stored by latch 292 when the next state machine 72 moves out of the program verification state. The Q output of latch 292 is fed back to the 10 input of multiplexer 290. When CMPEN 287 becomes inactive, the 10 input of multiplexer 290 is selected allowing it to control the latch 292.

MATCH 94 is reset by RESET 52.

The operation of the data latch and comparator circuits 270a–270h during erase verification is similar to that described above for program verification, with the following exceptions. First, I1 inputs of multiplexers 276a–276h are set to a logic 1 by the active COMPDAT1 signal during erase verification. This establishes a voltage reference with which to compare the sense amp outputs. Second, the active ERASE signal 40 selects the I1 inputs of multiplexers 276a–276h to be output to the comparators 278a–278h. Third, the PGVER signal is inactive, which permits comparators 278a–288h to operate without modification.

The DLC SBUS decoders 282, 284 and 286 help control the operation of data latch and comparator circuits 272a–272h. The operation of DLC SBUS decoders 282, 284 and 286 can be determined with reference to FIG. 6. For example, FIG. 6 indicates that in the ERASE_INC_ADD, ERASE_INC_DELAY and ERASE_VERIFY states 184, 186, 180 DLC SBUS decoder 286 sets CMPEN signal high.

In a preferred embodiment, DLC SBUS decoders 282, 284, and 286 are implemented in random logic.

FIG. 14 illustrates in block diagram form the status register 34. The status register 34 includes a clock generator 300; five output latches 302a–302e, one for each bit of signal STATUS[3:7] 56; status register SBUS decoders 304 and 306; latches 308 and 312; OR gates 310 and 314; and inverter 316.

The status register's outputs 56 are synchronized to output enable bar signal OEB 46a. The clock generator 300 accomplishes this synchronization by generating a set of clock pulses PH'1/PH'2 320 whenever OEB toggles. Clock pulses PH'1/PH'2 320 control the clocking in of data into output latches 302a–302e. Thus, it will be understood that OEB 42 must be toggled in order to read valid data from the output latches 302a–302e.

The signals READY 50, IDLE 53, and LOWVPP 51 are input directly to the D inputs of output latches 302a–302c respectively.

Status register SBUS decoder 304 decodes SBUS[0:4] 54 to detect program failures. When SBUS decoder 304 detects a failure, PRG-FAIL signal 322 is set to a logic 1. Because SBUS[0:4] 54 indicates a program failure for only one state period, the active PRGFAIL signal 322 is stored using latch 308 and OR gate 310, until the microprocessor 999 chooses to reset the status register 34. The status register 34 is reset by bringing STATRS 45 active. This pair of devices 308 and 310 operates in the same as a substantially similar pair of devices in the period counter 76.

Status register SBUS decoder 306 decodes SBUS[0:4] 54 to detect erase failures. When SBUS decoder 306 detects a failure ERSFAIL signal 324 is set high. Because SBUS[0:4] 54 indicates an erase failure for only one state period, the active ERSFAIL signal 324 is stored using latch 312 and OR gate 314 until the microprocessor 999 chooses to reset the status register. This pair of devices 312 and 314 operates in the same manner as a substantially similar pair of devices in the period counter 76.

FIG. 6 includes the operation of status register SBUS decoders 304 and 306. For example, FIG. 6 indicates that for all hardware failure states, PRG_ERR is set.

In a preferred embodiment, both status register SBUS decoders 304 and 306 are implemented in random logic.

The active outputs of latches 308 and 312 are reset when status register reset signal STATRS 45 is active high, which occurs as the result of the CLEAR STATUS REGISTER command from the microprocessor 999.

STATUS[3:7] outputs 56 include RDY/BSY signal, also known as STAT7. When RDY/BSY is a logic zero the write state machine 32 is busy. A logic one on STAT 7 indicates that the write state machine 32 has completed its operation and is prepared to perform another operation and that the other status outputs are valid.

The STAT 6 signal is also known as the ERASE_SUSPEND signal. ERASE_SUSPEND becomes active, a logic 1, when the WSM 32 has entered an idle state during an erase operation, and indicates that array 22 is readable. ERASE_SUSPEND is set and cleared by the synchronizer 30, based upon a request from the microprocessor 999 and the status of the WSM 32.

The STAT 5 signal is also known as the erase error ERASE_ERR signal. The ERASE_ERR signal is set to a logic 1 if the WSM 32 cannot successfully preprogram or erase the array. ERASE_ERR is also set to a logic if the erase command is botched or a hardware error is encountered. The ERASE_ERR signal is set by the WSM 32 and cleared by the STATUS REGISTER CLEAR command.

The STAT 4 signal is also known as the program error signal PRG_ERR. PRG_ERR is set to a logic one if the WSM 32 cannot successfully program a byte. PRG_ERR is also set to a logic 1 if an erase command is botched or a hardware error is encountered. PRG_ERR is set by the SBUS signals 54 and cleared by the STATUS REGISTER CLEAR command.

The STAT 3 signal is also known as the VPPLOW signal 51. VPPLOW 51 is set if the programming voltage Vpp 36 drops anytime during a program or erase operation. However, if PRG_ERR or ERASE_ERR is also set then the low Vpp 36 level had no effect on the operation. VPPLOW 51 is cleared by STATRS 45.

The status register 34 also outputs to the synchronizer 30 the status register reset bar signal STATRB 61, which is an inversion of STATRS 45.

In summary, circuitry for programming and erasing a non-volatile flash memory has been described. Once a program or an erase sequence is initiated, the write state circuitry generates all control signals necessary to complete the requested operation, thus freeing the microprocessor 999 to perform other functions.

II. TEST MODE OPERATION

A. Test Mode Overview

By automating programming and erasure write state machine 32 reduces and frustrates access by test engineers to cells within memory array 22. The present invention aids reliability testing of memory array 22 by allowing external control of the write state machine's algorithms. The method of the present invention utilizes a test mode controller and a modified write state machine. External inputs to write state machine 32 are handled via test mode controller 29. Modifications to write state machine 32 allow it to receive and transmit signals to test mode controller 29.

The present invention accommodates a specific type of reliability test: determination of memory array erasure characteristics. A first test determines the number of pulses required to erase the entire array. A second test determines the percentage of the array that responds to each erase pulse.

Determining the minimum number of erase pulses required to completely erase array 22 is an iterative process. Briefly stated, the process begins by configuring test mode controller 29 to prevent preconditioning of array 22 and to allow the application of only one erase pulse at a time to array 22. Next, the ERASE command is issued. The success of the erase pulse is determined and, if erasure of the entire array fails, testing continues by issuing another ERASE command. This process continues until every byte within array 22 is erased.

Determining the percentage of the array that erases in response to each erase pulse is also an iterative process. Briefly stated, the test begins by configuring test mode controller 29 to prevent preconditioning of array 22 and to allow the application of a single erase pulse to array 22. Next, the ERASE command is issued. The success of the erase pulse is determined and, if erasure fails, testing continues by configuring the test mode controller to continue erase verification. Erase verification continues until every byte within array 22 has been verified. If any bytes were not successfully erased, testing continues by reconfiguring test mode controller 29 to apply a single erase pulse to array 22. Array verification proceeds as before. Erasure and verification is repeated until every byte within array 22 is successfully erased.

B. Test Mode Controller

Testing of memory array 22 is controlled by test mode controller 29. Test mode controller 29 includes registers that store a number of writable test bits. These test bits may be individually set to create desired testing conditions. When propagated to write state machine 32, the test bits alter the normal operation of WSM 32 and cause it to execute the desired test. Test mode controller 29 also includes read-only registers that allow the internal state of WSM 32 to be determined.

Refering to FIG. 1, the operation of test mode controller 29 is controlled by command state machine 28. In response to the appropriate combination of signals, CEB 44 and WEB 46, and data signals 27, command state machine 28 enables test mode controller 29. Thereafter, commands and data may be written to test mode controller 29 using address pins 24 and data pins 26. After test bits are set, testing begins upon receipt of an active GO signal from command state machine 28. Upon completion of a test, results can be determined by reading various test registers.

Enabling test mode controller 29 is a multistep process. First, WEB 46 is raised to 12 volts. Second, after a wait of at least 200 nanoseconds, CEB 44 is also pulled up to 12 volts. Finally, after a second wait of at least 200 nanoseconds, WEB 46 is lowered to 5 volts. In response to this sequence, command state machine 28 forces test enable signal ENTESTB to its active, logic-low state. Thereafter, test latches within test mode register 29 may be accessed.

Most tests begin by writing to test registers. Test latch writes are performed much like any other write to flash memory 20. The WRITE TEST LATCH command is described in FIG. 2, along with other test mode commands. A test mode write takes 2 cycles. During the first cycle, hexadecimal 5F is written on data pins 26. During the second cycle, the memory user addresses the desired bit within the desired test register using address pins 24. The desired data is written using data pins 26.

After writing test mode registers, it may be desired to read them to verify that the registers contain the correct data. Before the test mode is deactivated, test mode register may be read by pulling CEB 44 and OEB low. After test mode has been deactivated or after a user mode read, test registers may be read using the command TEST LATCH READ. This command is given by writing OF hexadecimal to pins 26. Data will be available on pins D[3:7] 26 while CEB 44 and OEB are low.

Once the desired test bits have been set, testing begins by giving the command TEST MODE GO; i.e. by writing 2FH on data pins 26. TEST MODE GO activates the outputs of the test mode latches and propagates them to write state machine 32. This command ensures that all test mode signals become active at the same time.

The completion of a program or erase operation under test can be sensed by reading status register 34. Afterward, if desired, various internal signals may be read. Outputs from next state logic 110 are available after issuing to a TEST LATCH READ. Thereafter, subsequent read cycles access test registers and not memory array 22. Test mode controller 29 allows a user to read the address at which erase verification failed. Failing addresses are output in response to a series of read commands. In response to each read command, four or five bits of the requested address are output on pins D[3:7]. The addresses for the address latch bits are shown in FIG. 15.

The commands WRITE TEST LATCH, TEST MODE GO, TEST LATCH READ, and TEST MODE STOP redirect the output from memory array 22 and direct it to test mode registers. The output from memory array 22 can be redirected to data pins 26 by issuing the USER MODE READ command.

After testing is completed, test mode signals are deactivated using the TEST MODE STOP command. This command returns write state machine 32 to normal operation. The read path may then be returned to the memory array using the USER MODE READ command.

FIG. 16 illustrates in block diagram form test mode controller 29. Test mode controller 29 includes several test register selects 302, 304, 306, and 307 and test registers 308, 310, 312, and 313. Register 313 varies from the other latches in that it is a read-only-latch. The operation of register selects 302, 304, 306, and 307 and registers 308, 310, 312, and 313 is controlled by signals from command state machine 28: ENTESTB 314, LATWRITEB 316, LATREADB 318 and GO 320.

The outputs of registers 308, 310, 312, and 313 are held inactive and reset by the test mode enable signal, ENTESTB 314. While ENTESTB 314 is inactive-logic high test mode outputs 25 cannot change. When ENTESTB 314 goes active registers 308, 310 and 312 may be written to or read. Command state machine 28 brings ENTESTB 314 inactive when the test mode is disabled.

After entering test mode, command state machine 28 brings LATWRITEB 316 active-logic low in response to a TEST LATCH WRITE command. Similarly, command state machine 28 forces the test register read signal, LATREADB 318, active low in response to a TEST LATCH READ command.

Register selects 302, 304, 306, and 307 select the appropriate register based upon addresses available on A[4:7] 24. Register 308, also called register 5, is addressed by bringing A[4:7] to 0101. Registers 310 and 312, also known as registers 6 and 7, are addressed by bringing A[4:7] to (0110) and (0111), respectively. When a particular register is selected by the appropriate signals on A[4:7] 24, its associated register select enables it to perform the operation indicated by signals LATWRITEB 316 and LATREADB 318. Thus, for example, in response to A[4:7]=0101 and active LATWRITEB, register select 302 outputs an active write signal, WRITEL5 322, to to register 308. Similarly, in response to the address A[4:7]=0111 and LATREADB 318 active, register select 306 forces it latch read signal, READL7 324, active.

Register 313 is a read only register that is coupled to address counter 78 and next state controller 72. By addressing register 313, data normally not available external to flash memory 20 is output on data pins 26. Such data includes SBUS values and the last address at which erase verification was performed.

Data stored within registers 308, 310, 312, and 313 is output onto D[3:7] 26 while LATREADB 318 is active. Data on pins D(3:7) 26 is written into registers 308, 310, and 312 while LATWRITEB 316 is active. Data stored within registers 301, 310 and 312 is not propagated until the command state machine 28 brings GO signal 320 active in response to the command TEST MODE GO.

FIG. 17 describes the addresses of the test mode bits. For example, to write or read ADJEC0, A[4:7] must be set to (0111) in conjunction with the appropriate command.

The functions implemented by the test mode bits are also described in FIG. 17. These signals alter the normal operation of write state machine 32 and permit flash memory users to tailor tests to their particular needs.

Preconditioning prior to erasure is eliminated by NOPREC 334, when it is active. NOPREC 334 also prevents the resetting of address counter 78 before erase verification.

ADJEC0 340 and ADJEC1 342 adjust the number of program and erase pulses applied prior to period counter 52 reaches its terminal count. When ADJEC(0:1)=01 only one pulse is applied during programming and erasure. No pulses are applied during erasure when ADJEC(0:1)=10.

The manner in which test signals 334, 340 and 342 alter the operation of WSM 32 will be discussed in detail in the following sections.

C. Memory Array Testing

Test mode controller 29 may be configured to determine the minimum number of erase pulses necessary to erase all bytes within array 22. Test mode controller 29 may also be used to determine the percentage of bytes within array 22 that erase in response to each erase pulse. Both of these tests utilize NOPREC 334, ADJEC0 340 and ADJEC1 342. These tests are preferably executed using a computer controlled tester to generate all necessary input signals and to read all output data; however, less sophisticated means of implementing the present erase tests may also be used.

The method of determining the minimum number of pulses required to erase array 22 is illustrated in FIG. 18. Determining the minimum number of erase pulses required to completely erase array 22 is an iterative process. Briefly stated, the process begins by configuring test mode controller 29 to prevent preconditioning of array 22 and to allow the application of only one erase pulse at a time to array 22. Next, the ERASE command is issued. The success of the erase pulse is determined and, if erasure fails, testing continues by issuing another ERASE command. This process continues until every byte within array 22 is erased.

Prior to beginning testing of array erase characteristics, array 22 is preconditioned in step 400 using the PROGRAM command. Preconditioning of array 22 prevents damaging the flash memory during erasure.

In step 402, the tester forces flash memory 20 into test mode using the command sequence discussed in Section IIB.

After entering test mode, in step 404, the tester configures test mode controller 29 to apply a single erase pulse to array 22 and to eliminate array preconditioning. This configuration is achieved by the appropriate writing of test mode bits NOPREC 334, ADJEC0 340 and ADJEC1 342. On the second cycle of the WRITE TEST LATCH command A[4:7] should be a binary (0111) and D[3:7] 26 set to a binary (10001). This combination of inputs signals will bring NOPREC 334 active and set ADJEC(0:1) to 01. These signals are propagated to WSM 32 using the TEST MODE GO command.

The tester then proceeds to step 404, in which a pulse counter, COUNTER, is initialized to one. The tester will use COUNTER to determine the number of erase pulses that have to be applied before each byte within array 22 is successfully erased. COUNTER is generated and stored by the tester.

In step 406 the tester initializes an erase verification address, ADDRESS, to the beginning of array 22. ADDRESS is used throughout the test to indicate where WSM 32 should begin erase verification after each erase pulse. Like COUNTER, ADDRESS is generated and stored by the tester.

The first erase pulse is applied to array 22 during the first pass through step 408. The tester applies the erase pulse by issuing an ERASE command in conjunction with ADDRESS.

During step 410, the tester determines whether the last erase pulse successfully erased all bytes within array 22. The tester makes this determination by polling status register 34 using the STATUS READ command until RDY/BSY bit indicates that WSM 32 has completed erasure. If erasure is complete, its success is determined by reading ERASE FAIL bit. If ERASE FAIL is a logic low, erasure was successful and the test ends. On the other hand, if ERASE FAIL is a logic high, erasure failed. Prior to continuing, the tester clears status register 34 in preparation for future erase verification.

When ERASE FAIL is active high, testing continues by branching to step 412. During step 412, the tester increments COUNTER because at least one more erase pulse will be applied to array 22 before every byte is successfully erase verified.

In step 414, the address at which erase-verification failed is determined. Flash memory 20 outputs the failing address on data pins D[0:7] 26 in response to a series of TEST LATCH READ commands which utilize addresses described in FIG. 17.

In step 416, the tester sets ADDRESS to the address at which erase-verification failed. From step 416 the tester branches back to step 408 to apply yet another erase pulse to array 22. Write state machine 32 will begin erase-verification with the byte indicated by ADDRESS.

The tester continues to branch through steps 408 through 416 until status register 34 indicates that every byte within array 22 has been successfully erased. At that point, the minimum erase test is complete and COUNTER indicates the number of erase pulses that were necessary.

Tester mode controller 29 may also be configured to determine the number of bytes within array 22 that erase in response to each erase pulse. The flow diagram for this test is illustrated in FIG. 19. As can be seen, this test is also an incremental process. Briefly stated, the test begins by configuring test mode controller 29 to prevent preconditioning of array 22 and to allow the application of a single erase pulse to array 22. Next, the ERASE command is issued. The success of the erase pulse is determined and, if erasure fails, testing continues by configuring the test mode controller to continue erase verification. Erase verification continues until every byte within array 22 has been verified. If any bytes were not successfully erased, testing continues by reconfiguring test mode controller 29 to apply a single erase pulse to array 22. Erasure and verification is repeated until every byte within array 22 is successfully erased.

Prior to beginning testing, array 22 is preconditioned in step 500 using the PROGRAM command. Preconditioning of array 22 prevents damaging it during erasure.

In step 502, the tester forces flash memory 20 into test mode using the command sequence previously discussed.

In step 504, the tester initializes two counters, which the tester generates and stores. The first counter, PULSE, keeps track of the number of erase pulses that have been applied to array 22. PULSE is initialized to zero. The second counter, BYTE, keeps track of the number of bytes within array 22 that have been successfully erased so far. BYTE is initialized to one.

Afterward, in step 506, the tester configures test mode controller 29 to apply a single erase pulse to array 22 and to eliminate array preconditioning. This configuration is achieved by the appropriate writing of test mode bits NOPREC 334, ADJEC0 340 and ADJEC1 342, as discussed previously. These signals are propagated to WSM 32 using the TEST MODE GO command.

In step 508 the tester initializes an erase verification address, ADDRESS, to the beginning of array 22. ADDRESS is used throughout the test to indicate where WSM 32 should begin erase verification after each erase pulse.

Testing begins in step 510 by applying a single erase pulse to array 22. As discussed in Section I, after applying the erase pulse write state machine 32 begins to verify the erasure of array 22. Write state machine 32 ceases verification as soon as a byte within array 22 fails to pass erase-verification, or when every byte has been verified.

In step 512 the tester determines whether the last erase pulse successfully erased all bytes within array 22. The tester makes this determination by polling status register 34 until the RDY/BSY bit indicates that WSM 32 has completed erasure. If erasure is complete, its success is determined by reading the ERASE FAIL bit. If the ERASE FAIL bit is a logic low, erasure was successful and the tester branches to step 530. On the other hand, if the ERASE FAIL bit is a logic high, erasure failed and the test continues. The tester should then clear status register 34 in preparation for future erase verification.

The tester determines the address at which erasure failed and verification stopped in step 514 using the TEST LATCH READ command.

Given the failing address, in step 516 the tester determines the number of bytes successfully erased before a byte failed erase verification. This determination is made by subtracting the address at which verification began plus one from the failing address. BYTE is then incremented by the number of bytes calculated.

The tester determines whether erase-verification should end in step 518 by comparing the failing address to the last address within array 22. If there's a match, the tester branches ahead to step 526. On the other hand, if the two addresses do not match, not every byte within array 22 has been erase verified and the process of determining the number of bytes erased by the last pulse continues by branching to state 520.

The tester prepares to continue erase verification in step 520 by setting ADDRESS to the failing address plus one. In step 522 this preparation continues by configuring test mode controller 29 to perform erase verification. This is done by preventing write state machine 32 from preconditioning array 22 and preventing the application of erase pulses to array 22. These results are achieved by bringing NOPREC 334 active and setting ADJEC(0:1) to a binary 10. These signals are propagated to WSM 32 using the command TEST MODE GO.

Erase verification resumes in step 524 by issuing an ERASE command in conjunction with the application of ADDRESS to address pins 24.

When write state machine 32 stops erase verification, as indicated by status register 34, the tester branches to step 514. There the tester determines where erase verification stopped by reading the last address from test register 313.

From step 514, the tester repeats steps 516, 518, 520, 522, 524 and 514 until each byte within array 22 has been verified. When that occurs the tester branches to step 526.

In step 526 the current values for BYTE and PULSE are stored. Preparation for the application of another pulse begins in step 528 by incrementing PULSE.

From step 528 the tester branches back to step 506. During step 506 test mode controller 29 is configured to apply a single erase pulse to array 22. The tester then branches through steps 508, 510, 512, 514, 516, 518, 520, 522, 524, 526, and 528 until for some value of PULSE status register 34 indicates that erasure was successful.

From state 512 the tester branches to state 530 when erasure is successful. In step 530 BYTE is set to its maximum value.

In state 532 the tester stores the final values of BYTE and PULSE. Testing then ends.

D. Modifications to WSM to Permit Array Testing

Modifications to write state machine 32 as described in Section I are necessary to allow WSM 32 to respond to test mode signals NOPREC 334, ADJEC0 340 and ADJEC1 342. Modifications to both next state logic 110 and event counter 74 are necessary.

Modification to next state logic 110 is relatively minor: the addition of an additional input, NOPREC 334. The effect of NOPREC 334 is to change the normal operation of write state machine 332. When active, NOPREC 334 causes next state logic 110 to branch immediately from POWER UP, state 120, to ERASE SET UP2, state 172. Thus, branch 1002 eliminates the array preconditioning that typically precedes erasure. When inactive NOPREC 334 has no effect upon the operation of WSM 32.

Modifications to event counter 74 involve SBUS decoder 230 and the addition of NOR gate 239. Decoder 230 now recognizes two additional inputs, ADJEC0 340 and ADJEC1 340, and provides two additional outputs, labeled one and zero. When ADJEC0 340 is active high SBUS decoder 230 outputs a logic one on line 245. This forces the output of NOR gate 239 high immediately and brings ECTRTC 90 high before a single pulse can be applied to array 22. ECTRTC 90 is still fed back around to NOR gate 238 to keep ECTRTC 90 active high even after line 245 goes back low.

SBUS decoder 230 brings line 247 to a logic high when ADJEC1 342 is a logic high. The output of NOR gate 238 goes high in response to a high on line 247, thereby inputting a logic one to D flip-flop 236. Thus, after the application of a single pulse to array 22, D flip-flop 236 outputs a logic high and forces ECTRTC 90 high.

Additionally, the method of FIG. 5 has been altered to respond to event counter 74 reaching its terminal count before the application of a single erase pulse. Branch 1004 takes next state logic 110 out of state 172 to state 180. Thus, in conjunction with branch 1002 and branch 1004, write state machine 32 can be forced to perform erase verification immediately upon power up.

An analogous branch around programming has been provided out of state 132. Branch 1000 allows write state machine 32 to perform program verification without programming.

Thus, a method of verifying the erase characteristics of a flash memory array that includes an on-board write state machine have been described.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of determining erasure characteristics of a flash memory array using an on-board write state machine, said write state machine responsive to erase commands, said write state machine, upon receipt of an erase command, automatically preconditioning the memory array and erasing the memory array by repetitively applying a plurality of pulses and verifying erasure until erasure of the array is verified, the method for determining erasure characteristics comprising the steps of:
- a) configuring the write state machine to prevent preconditioning and to apply a single erase pulse to the memory array in response to subsequently received erase commands;
- b) issuing an erase command to the write state machine;
- c) said write state machine applying a single erase pulse to the memory array in response to the issued erase command;
- d) if array erasure is unsuccessful, issuing another erase command to the write State machine;
- e) repeating steps b), c) and d) until the entire array is successfully erased.

2. The method of claim 1 wherein said step of configuring the write state machine comprises:
- a) setting at least one first test bit to prevent array preconditioning prior to erasure; and
- b) setting at least one second test bit to allow the application of a single erase pulse to the array.

3. A method of determining erasure characteristics of a flash memory array using an on-board write state machine said write state machine responsive to erase commands, said write state machine, upon receipt of an erase command, automatically preconditioning and erasing the memory array by repetitively applying a plurality of pulses and verifying erasure until erasure of the array is verified, the method for determining erasure characteristics comprising the steps of:
- a) configuring the write state machine to allow determination of erasure characteristics by setting a first test bit and a second test bit;
- b) initializing a counter;
- c) propagating the first test bit and the second test bit to the write state machine;
- d) issuing an erase command;
- e) said write state machine preventing array preconditioning in response to the first test bit;
- f) said write state machine applying a single erase pulse to each byte within the array in response to the second test bit;
- g) if array erasure is unsuccessful incrementing the counter; and
- h) if array erasure is unsuccessful repeating steps d) through g) until every byte within the array is successfully erased.

4. A method of determining erasure characteristics of a flash memory array using an on-board write state machine, said write state machine responsive to erase commands, said write state machine, upon receipt of an erase command, automatically preconditioning the memory array and erasing the memory array by repetitively applying a plurality of pulses and verifying erasure until erasure of the array is verified, the method for determining erasure characteristics comprising the steps of:
- a) configuring the write state machine to prevent preconditioning and apply a single erase pulse to the array in response to subsequently received erase commands;
- b) issuing an array erase command to the write state machine; and
- c) determining a number of bytes within the array that are erased;
- d) if not every byte is erased, configuring the write state machine to continue erase verification;
- e) issuing an erase command;
- f) repeating steps c) through e) until every byte has been erase verified;
- g) repeating steps a) through f) until every byte within the array is successfully erased.

5. The method of claim 4 wherein the step of configuring the write state machine to apply a single erase pulse comprises the steps of:
- a) setting a first test bit to prevent array preconditioning prior to erasure; and
- b) setting a second test bit to allow the application of a single erase pulse to the array.

6. The synchronous DRAM system as set forth in claim 2, wherein the processor further comprises a means for grouping refresh signals in a burst to refresh a plurality of rows.

7. A method of determining erasure characteristics of a flash memory array using an on-board write state machine, said write state machine responsive to erase commands, said write state machine, upon receipt of an erase command, automatically preconditioning and erasing the array by repetitively applying a plurality of pulses and verifying erasure until erasure of the array is verified, the method for determining erasure characteristics comprising the steps of:
- a) configuring the write state machine to allow determination of erasure characteristics by setting a first bit, a second bit, and a third bit;
- b) propagating the first bit, the second bit, and the third bit to the write state machine;
- c) issuing an array erase command;
- d) preventing preconditioning of the array by the write state machine in response to the first bit;
- e) allowing the application of only one erase pulse by the write state machine to each byte within the array in response to the second bit and the third bit;
- c) determining a number of bytes within the array that are erased;
- d) if not every byte was erased, configuring the write state machine by changing the setting of the second bit and the third bit;
- e) propagating the first bit, the second bit, and the third bit to the write state machine;
- f) issuing an erase command;
- g) preventing preconditioning of the array by said write state machine in response to the first bit;
- h) preventing the application of erase pulses to the array by said write state machine in response to the second bit and the third bit;
- i) repeating steps c) through h) until every byte has been erase verified;
- j) repeating steps a) through i) until every byte within the array is erased.

* * * * *